US012593455B2

(12) United States Patent
Ogura et al.

(10) Patent No.: US 12,593,455 B2
(45) Date of Patent: Mar. 31, 2026

(54) METHOD OF MANUFACTURING SEMICONDUCTOR DEVICE

(71) Applicant: RENESAS ELECTRONICS CORPORATION, Tokyo (JP)

(72) Inventors: Ryo Ogura, Tokyo (JP); Takahiro Maruyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 666 days.

(21) Appl. No.: 18/054,981

(22) Filed: Nov. 14, 2022

(65) Prior Publication Data

US 2024/0164112 A1      May 16, 2024

(51) Int. Cl.
| | |
|---|---|
| *H10B 51/40* | (2023.01) |
| *H10B 51/30* | (2023.01) |
| *H10D 30/01* | (2025.01) |
| *H10D 30/69* | (2025.01) |
| *H10D 64/68* | (2025.01) |

(52) U.S. Cl.
CPC ............. *H10B 51/40* (2023.02); *H10B 51/30* (2023.02); *H10D 30/0415* (2025.01); *H10D 30/701* (2025.01); *H10D 64/689* (2025.01)

(58) Field of Classification Search
CPC ........ H10B 51/10; H10B 51/30; H10B 51/40; H10D 30/0415; H10D 30/701; H10D 64/689
See application file for complete search history.

(56) References Cited

U.S. PATENT DOCUMENTS

| | | | |
|---|---|---|---|
| 8,877,625 B1 * | 11/2014 | Lian ..................... | H10D 84/038 |
| | | | 257/327 |
| 10,998,408 B2 | 5/2021 | Yamaguchi | |
| 2019/0123182 A1 * | 4/2019 | Yamamoto ............. | H10D 86/01 |
| 2019/0207009 A1 * | 7/2019 | Yamaguchi .......... | H10D 30/701 |
| 2022/0123000 A1 * | 4/2022 | Omizu .................. | H10B 41/35 |

FOREIGN PATENT DOCUMENTS

| | | | | |
|---|---|---|---|---|
| CN | 118042844 A | * | 5/2024 | .......... H10D 30/701 |
| JP | 2019-201172 A | | 11/2019 | |

* cited by examiner

*Primary Examiner* — Matthew E Warren
(74) *Attorney, Agent, or Firm* — Rimon P.C.

(57)      ABSTRACT

This is a manufacturing method of a semiconductor device having a first region, a second region, and a third region. A second gate dielectric film is formed on a semiconductor substrate in the second region. A thin first gate dielectric film is formed on the semiconductor substrate in the first region. A protective film is formed on the first gate dielectric film and on the second gate dielectric film. A thin paraelectric film is formed on the semiconductor substrate in the third region. An amorphous film formed of a material including a metal oxide and a first element is formed on the protective film and on the paraelectric film. A metal film is formed on the amorphous film. By performing a heat treatment, the amorphous film is crystallized to form a ferroelectric film.

8 Claims, 33 Drawing Sheets

|  | Vmg | Vsg | Vms | Vmd | Vpw |
|---|---|---|---|---|---|
| WRITE OPERATION [V] | −4 | 1 | 0 | 0 | 0 |
| ERASE OPERATION [V] | 4 | 1 | 0 | 0 | 0 |
| READ OPERATION [V] | 0 | 1 | 0 | Vdd | 0 |

<Embodiment 1: Fig.10>

<Embodiment 1: Fig.14>

<Examination case 1>

*FIG. 30*

<Examination case 1>

*FIG. 31*

<Examination case 1>

*FIG. 32*

<Examination case 1>

METHOD OF MANUFACTURING SEMICONDUCTOR DEVICE

BACKGROUND

The present invention relates to a method of manufacturing a semiconductor device, and more particularly, to a semiconductor device and a method of manufacturing the same including a ferroelectric memory cell.

The Background of the Invention

In recent years, a ferroelectric memory cell using a ferroelectric film has been developed as a semiconductor memory element operating at a low voltage. The ferroelectric memory cell is a nonvolatile memory cell that changes a write state and an erase state of stored information by controlling a direction of polarization of the ferroelectric.

A semiconductor device (semiconductor chip) including such a ferroelectric memory cell includes a logic circuit including CPU (Central Processing Unit), SRAM (Static Random Access Memory), and I/O (Input/Output) circuits. The plurality of semiconductor elements configuring these circuits and the ferroelectric memory cell are formed on the same semiconductor substrate.

There are disclosed techniques listed below.
[Patent Document 1] Japanese Unexamined Patent Application Publication No. 2019-201172

For example, Patent Document 1 discloses a technique of forming a ferroelectric memory cell and a low withstand voltage MOSFET (Metal Oxide Semiconductor Field Effect Transistor) configuring a CPU on the same semiconductor substrate.

SUMMARY

When several types of semiconductor elements are formed on the same semiconductor substrate, such as a ferroelectric memory cell, a low withstand voltage MOS-FET, and a high withstand voltage MOSFET configuring an I/O circuit, a manufacturing process for forming a certain semiconductor element may affect a gate dielectric film or the like of another semiconductor element, and may change the characteristics of another semiconductor element. Therefore, there is a need for a technique for manufacturing a highly reliable semiconductor device without affecting other devices as much as possible. Other purpose and novel features will become apparent from the description of this specification and the accompanying drawings.

The typical ones of the embodiments disclosed in the present application will be briefly described as follows.

A method of manufacturing a semiconductor device according to one embodiment is a method of manufacturing a semiconductor device having a first region in which a first MOSFET is formed, a second region in which a second MOSFET is formed, and a third region in which a ferro-electric memory cell is formed. A method of manufacturing the semiconductor device includes: (a) forming a second gate dielectric film on a semiconductor substrate in the first region, the second region and the third region; (b) after the (a), selectively removing the second gate dielectric film in the first region; (c) after the (b), forming a first gate dielectric film having a thinner thickness than the second gate dielectric film on the semiconductor substrate in the first region; (d) after the (c), forming a protective film on the first gate dielectric film in the first region, the second gate dielectric film in the second region and the second gate dielectric film in the third region; (e) after the (d), selectively removing the protective film in the third region; (f) after the (e), selectively removing the second gate dielectric film in the third region; (g) after the (f), forming a paraelectric film having a thinner thickness than the second gate dielectric film on the semiconductor substrate in the third region; (h) after the (g), forming an amorphous film formed of a material including a metal oxide and a first element on the protective film in the first region, the protective film in the second region and the paraelectric film in the third region; (i) after the (h), forming a metal film on the amorphous film in the first region, the second region and the third region; (j) after the (i), crystallizing the amorphous film to form a ferroelectric film by performing a heat treatment; and (k) after the (j), selectively removing the metal film and the ferroelectric film in the first region and the second region.

A method of manufacturing a semiconductor device according to one embodiment is a method of manufacturing a semiconductor device having a first region in which a first MOSFET is formed, a second region in which a second MOSFET is formed, and a third region in which a ferro-electric memory cell is formed. A method of manufacturing the semiconductor device includes: (a) forming a second gate dielectric film on a semiconductor substrate in the first region, the second region and the third region; (b) after the (a), selectively removing the second gate dielectric film in the first region; (c) after the (b), forming a first gate dielectric film having a thinner thickness than the second gate dielectric film on the semiconductor substrate in the first region; (d) after the (c), forming a protective film on the first gate dielectric film in the first region, the second gate dielectric film in the second region and the second gate dielectric film in the third region; (e) after the (d), selectively removing the protective film in the third region; (f) after the (e), selectively removing the second gate dielectric film in the third region; (g) after the (f), forming a paraelectric film having a thinner thickness than the second gate dielectric film on the semiconductor substrate in the third region; (h) after the (g), forming an amorphous film formed of a material including a metal oxide and a first element on the protective film in the first region, the protective film in the second region and the paraelectric film in the third region; (i) after the (h), selectively removing the amorphous film in the first region and the second region; (j) after the (i), forming a metal film on the protective in the first region, the protective film in the second region and the amorphous film in the third region; (k) after the (j), crystallizing the amorphous film to form a ferroelectric film by performing a heat treatment; and (l) after the (k), selectively removing the metal film in the first region and the second region.

BRIEF DESCRIPTION OF THE DRAWINGS

FIG. 5 is a cross-sectional view showing a manufacturing process of the semiconductor device following FIG. 4.

FIG. 10 is a cross-sectional view showing a manufacturing process of the semiconductor device following FIG. 9.

FIG. 13 is a cross-sectional view showing a manufacturing process of the semiconductor device following FIG. 12.

FIG. 22 is a cross-sectional view showing a manufacturing process of a semiconductor device in a third embodiment.

FIG. 23 is a cross-sectional view showing a manufacturing process of the semiconductor device following FIG. 22.

FIG. 24 is a cross-sectional view showing a manufacturing process of the semiconductor device following FIG. 23.

FIG. 25 is a cross-sectional view showing a manufacturing process of the semiconductor device following FIG. 24.

FIG. 26 is a cross-sectional view showing a manufacturing process of a semiconductor device in a fourth embodiment.

FIG. 29 is a cross-sectional view showing a manufacturing process of a semiconductor device in a first examined example.

FIG. 30 is a cross-sectional view showing a manufacturing process of the semiconductor device following FIG. 29.

FIG. 31 is a cross-sectional view showing a manufacturing process of the semiconductor device following FIG. 30.

FIG. 32 is a cross-sectional view showing a manufacturing process of the semiconductor device following FIG. 31.

DETAILED DESCRIPTION

Figures 1, 2:
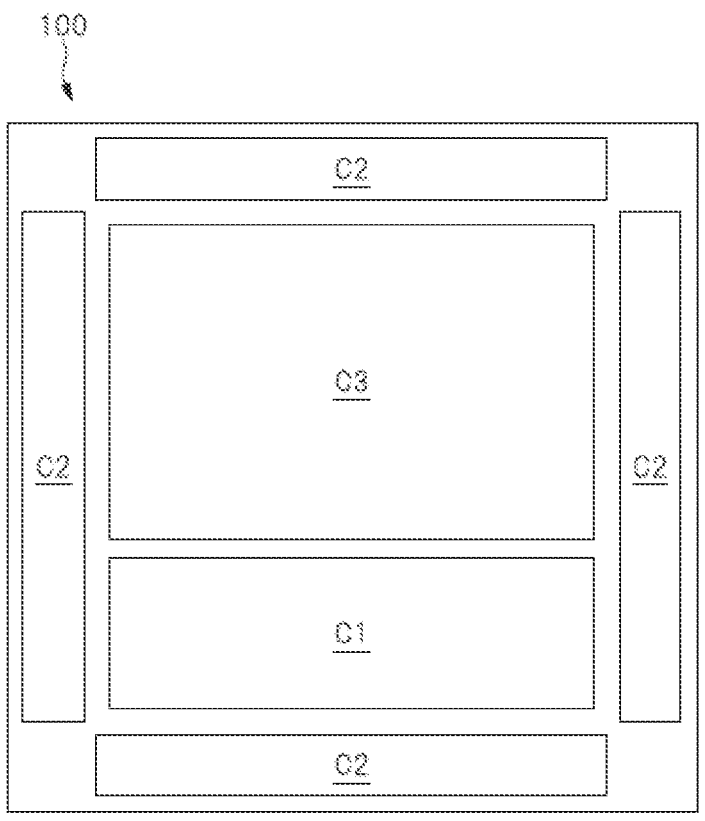
FIG. 1 is a plan view of a semiconductor device in a first embodiment.
FIG. 2 is a table showing an applied voltage during each operation of a ferroelectric memory cell.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

First Embodiment

Structure of Semiconductor Device

A semiconductor device 100 in the first embodiment will be described below with reference to FIGS. 1 to 3. The semiconductor device 100 has a ferroelectric memory cell MC as an electrically rewritable nonvolatile memory cell.

FIG. 1 is a plan view of a semiconductor chip that is the semiconductor device 100 in the first embodiment. The semiconductor device 100 has circuit regions C1, C2, C3.

In the circuit region C1, for example, a logic circuit including a CPU, and an SRAM are formed. The semiconductor elements configuring these circuits are low withstand voltage MOSFETs for driving with a voltage of about 1.0 V. In the circuit region C2, for example, an I/O circuit is formed. The semiconductor elements configuring this circuit are high withstand voltage MOSFETs for driving with a voltage of about 3.3 V. The ferroelectric memory cell MC is formed in the circuit region C3.

The semiconductor device 100 has regions 1A to 3A. FIG. 3 is a cross-sectional view showing a semiconductor element formed in the regions 1A to 3A. The region 1A is a region in which a low withstand voltage MOSFET1Q configuring the circuit region C1 is formed. The region 2A is a region in which a high withstand voltage MOSFET2Q configuring the circuit region C2 is formed. The region 3A is a region in which the ferroelectric memory cell MC configuring the circuit region C3 is formed.

A semiconductor substrate SUB is formed of, for example, p-type monocrystalline silicon (Si). A p-type well region PW1 is formed in the semiconductor substrate SUB in the region 1A. A p-type well region PW2 is formed in the semiconductor substrate SUB in the region 2A. A p-type well region PW3 is formed in the semiconductor substrate SUB in the region 3A.

First, the low withstand voltage MOSFET1Q in the region LA will be described. The Low withstand voltage MOSFET1Q includes a gate dielectric film GI1, a gate electrode GE1, a sidewall spacer SW, a source region, and a drain region.

The gate dielectric film GI1 is formed on the semiconductor substrate SUB including the well region PW1. The gate dielectric film GI1 is, for example, a silicon oxide film, and has a thickness of, for example, 1 nm or more and 2 nm or less.

The gate electrode GE1 is formed on the gate dielectric film GI1. The gate electrode GE1 is, for example, a polycrystalline silicon film in which n-type impurities are implanted. The sidewall spacer SW is formed on a side surface of the gate electrode GE1. The sidewall spacer SW is formed of, for example, a laminated film of a silicon oxide film and a silicon nitride film.

Each of the source region and the drain region has an extension region EX and a diffusion region ND. The extension region EX, which is a low concentration n-type impurity region, is formed in the semiconductor substrate SUB under the sidewall spacer SW. Further, the diffusion region ND, which is an n-type impurity region having a higher concentration than the extension region EX, is formed in the semiconductor substrate SUB exposed from the sidewall spacer SW. The extension region EX and the diffusion region ND are connected to each other and configure a part of the source region or a part of the drain region of the low withstand voltage MOSFET1Q, respectively.

Next, the high withstand voltage MOSFET2Q in the region 2A will be described. The high withstand voltage MOSFET2Q includes a gate dielectric film GI2, a gate electrode GE2, a sidewall spacer SW, a source region, and a drain region.

The gate dielectric film GI2 is formed on the semiconductor substrate SUB including the well region PW2. The gate dielectric film GI2 is, for example, a silicon oxide film, has a larger thickness than the gate dielectric film GI1, and has a thickness of, for example, 8 nm or more and 20 nm or less.

The gate electrode GE2 is formed on the gate dielectric film GI2. The gate electrode GE2 is, for example, a polycrystalline silicon film in which n-type impurities are implanted. The sidewall spacer SW is formed on a side surface of the gate electrode GE2.

Each of the source region and the drain region has a low concentration region LDD and a diffusion region ND. The low concentration region LDD, which is a low concentration n-type impurity region, is formed in the semiconductor substrate SUB under the sidewall spacer SW. Further, the diffusion region ND, which is an n-type impurity region having a higher concentration than the low concentration region LDD, is formed in the semiconductor substrate SUB exposed from the sidewall spacer SW. The low concentration region LDD and the diffusion region ND are connected to each other, and configure a part of the source region or a part of the drain region of the high withstand voltage MOSFET2Q, respectively.

Next, the ferroelectric memory cell MC in the region 3A will be described.

The ferroelectric memory cell MC includes a memory transistor MQ and a select transistor SQ. The memory transistor MQ has a MFIS (Metal Ferroelectric Insulator Semiconductor) structure in which a ferroelectric film FE is applied to a transistor. The memory transistor MQ includes a paraelectric film IL, a ferroelectric film FE, a metal film MF, and a memory gate electrode MG.

The paraelectric film IL is formed on the semiconductor substrate SUB including the well region PW3. The paraelectric film IL is, for example, a silicon oxide film, has a smaller thickness than the gate dielectric film GI2, and has a thickness of, for example, 0.5 nm or more and 3 nm or less. The paraelectric film IL is provided for the purpose of stabilizing the interface between the semiconductor substrate SUB and the ferroelectric film FE described later, or for the purpose of preventing electrons from entering the ferroelectric film FE from the semiconductor substrate SUB when a voltage is applied to the gate electrode GE described later during the operation of the ferroelectric memory cell MC.

The ferroelectric film FE is formed on the paraelectric film IL. The ferroelectric film FE is formed of a metal oxide film, and is, for example, a high dielectric constant film having a higher dielectric constant than a silicon nitride film.

The thickness of the ferroelectric film FE is, for example, 4 nm or more and 20 nm or less.

Further, the ferroelectric film FE is a dielectric film formed of a material in which dielectric polarization occurs when an electric field is generated from the outside, and polarization does not become zero even if the electric field is removed, that is, a ferroelectric. That is, even when an electric field is not applied, residual polarizations having a certain magnitude exist on the ferroelectric film FE.

The ferroelectric film FE needs to be crystals that are not centrosymmetric. In other words, the film formed by the centrosymmetric crystal is a paraelectric film. Therefore, in the ferroelectric memory cell MC, in order to realize an increase in the residual polarization of the ferroelectric film FE, an improvement in the performance as a ferroelectric, and a reduction in the driving power of the ferroelectric memory cell MC, the crystal configuring the ferroelectric film FE needs to be formed of a crystal that is not centrosymmetric. The crystal that is not centrosymmetric is, for example, orthorhombic or hexagonal.

The ferroelectric film FE in the first embodiment is formed of, for example, a material including a metal oxide and a first element. The metal oxide is, for example, hafnium oxide ($HfO_2$) or gallium oxide ($Ga_2O_3$). The first element is, for example, zirconium (Zr). The first element may be silicon (Si), nitrogen (N), yttrium (Y), germanium (Ge), lanthanum (La), or ytterbium (Yb) instead of zirconium.

The metal film MF is formed on the ferroelectric film FE. The metal film MF is, for example, a conductive film formed of a titanium nitride film, a tantalum nitride film, or a tungsten film. The thickness of the metal film MF is, for example, 10 nm or more and 20 nm or less.

The metal film MF is a capping film provided for applying stresses to the ferroelectric film FE during the manufacturing process of the ferroelectric film FE and controlling the orientation of the crystals of the ferroelectric film FE. Therefore, when the ferroelectric film FE can exist as orthogonal crystals after the ferroelectric film FE is formed, the metal film MF may be removed. However, it is more preferable to leave the metal film MF because the orientation of the crystals of the ferroelectric film FE may vary by removing the metal film MF. When the metal film MF is left, the metal film MF also functions as a part of a memory gate electrode MG described later.

The memory gate electrode MG is formed on the metal film MF. The memory gate electrode MG is, for example, a polycrystalline silicon film in which n-type impurities are implanted. The sidewall spacer SW is formed on a side surface of the memory gate electrode MG.

The low concentration region LDD, which is a low concentration n-type impurity region, is formed in the semiconductor substrate SUB under the sidewall spacer SW. Further, the diffusion region ND and the drain region MD, which are n-type impurity regions having a higher concentration than the low concentration region LDD, are formed in the semiconductor substrate SUB exposed from the sidewall spacer SW. The low concentration region LDD and the drain region MD are connected to each other and configure a part of the drain region of the ferroelectric memory cell MC.

The select transistor SQ includes a gate dielectric film GI2 and a select gate electrode SG.

The gate dielectric film GI2 is formed on the semiconductor substrate SUB including the well region PW3. The gate dielectric film GI2 in the region 3A is formed of the same material and the same thickness as gate dielectric film GI2 in the region 2A.

The select gate electrode SG is formed on the gate dielectric film GI2. The select gate electrode SG is, for example, a polycrystalline silicon film in which n-type impurities are implanted. The sidewall spacer SW is formed on a side surface of the select gate electrode SG.

The low concentration region LDD, which is a low concentration n-type impurity region, is formed in the semiconductor substrate SUB under the sidewall spacer SW. Further, the diffusion region ND and the source region MS, which are n-type impurity regions having a higher concentration than the low concentration region LDD, are formed in the semiconductor substrate SUB exposed from the sidewall spacer SW. The low concentration region LDD and the source region MS are connected to each other and configure a part of the source region of the ferroelectric memory cell MC.

The low concentration region LDD and the diffusion region ND formed between the select gate electrode SG and the memory gate electrode MG are connected to each other. As a result, the memory transistor MQ and the select transistor SQ can be electrically connected.

Although not shown here, silicide layers may be formed on the gate electrode GE1, the gate electrode GE2, the select gate electrode SG, the memory gate electrode MG, the diffusion region ND, the source region MS, and the drain region MD. The silicide layer is formed of, for example, cobalt silicide, nickel silicide, or nickel platinum silicide.

Operation of Ferroelectric Memory Cell MC

When the ferroelectric memory cell MC is operated, the voltage shown in FIG. 2 is applied. The voltage Vmg is a voltage applied to the memory gate electrode MG. The voltage Vsg is a voltage applied to the select gate electrode SG. The voltage Vms is a voltage applied to the source region MS. The voltage Vmd is a voltage applied to the drain region MD. The voltage Vpw is a voltage applied to the well region PW.

In the write operation, a voltage as shown in the column of "write operation" in FIG. 2 is applied to the ferroelectric memory cell MC. As a result, the positive residual polarization is left in the ferroelectric film FE, the polarization direction is upward, the threshold voltage of the ferroelectric memory cell MC increases, and the ferroelectric memory cell MC is in a write state.

In the erase operation, a voltage as shown in the "erase operation" column in FIG. 2 is applied to the ferroelectric memory cell MC. As a result, the negative residual polarization is left in the ferroelectric film FE, the polarization direction is downward, the threshold voltage of the ferroelectric memory cell MC is lowered, and the ferroelectric memory cell MC is in an erase state.

The voltage applied to the gate electrode GE during the read operation is set to be smaller than the threshold voltage of the ferroelectric memory cell MC in the write state and larger than the threshold voltage of the ferroelectric memory cell MC in the erase state. The voltage Vdd is, for example, a positive voltage of about 1 V to 3 V. As a result, the current does not flow in the ferroelectric memory cell MC in the write state, or even if the current flows, the amount thereof is small. On the other hand, a large current flows in the ferroelectric memory cell MC in the erase state. In this manner, the storage state of the ferroelectric memory cell MC can be determined based on the magnitude of the current flowing through the ferroelectric memory cell MC.

Method of Manufacturing Semiconductor Device

A method of manufacturing the semiconductor device in the first embodiment will be described below with reference to FIGS. 4 to 15.

Figure 4:
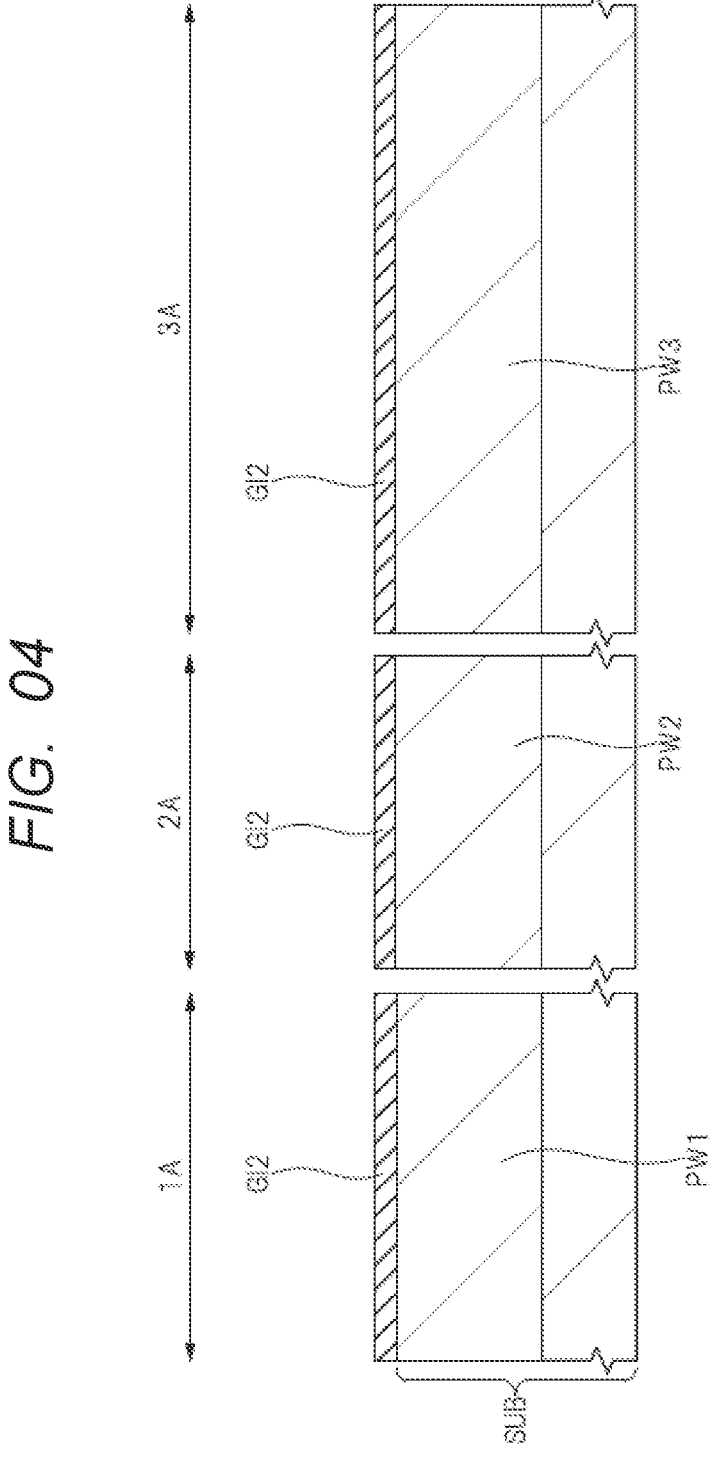
FIG. 4 is a cross-sectional view showing a manufacturing process of the semiconductor device in the first embodiment.

First, as shown in FIG. 4, the semiconductor substrate SUB formed of monocrystalline silicon into which, for example, p-type impurities are implanted is prepared. Next, by photolithography technique and ion implantation method, a well region PW1 is formed in the semiconductor substrate SUB in the region 1A, a well region PW2 is formed in the semiconductor substrate SUB in the region 2A, and a well region PW3 is formed in the semiconductor substrate SUB in the region 3A.

Next, a gate dielectric film GI2 is formed on the semiconductor substrate SUB in the region 1A, the region 2A, and the region 3A by, for example, a thermal oxidation method.

Figure 05:
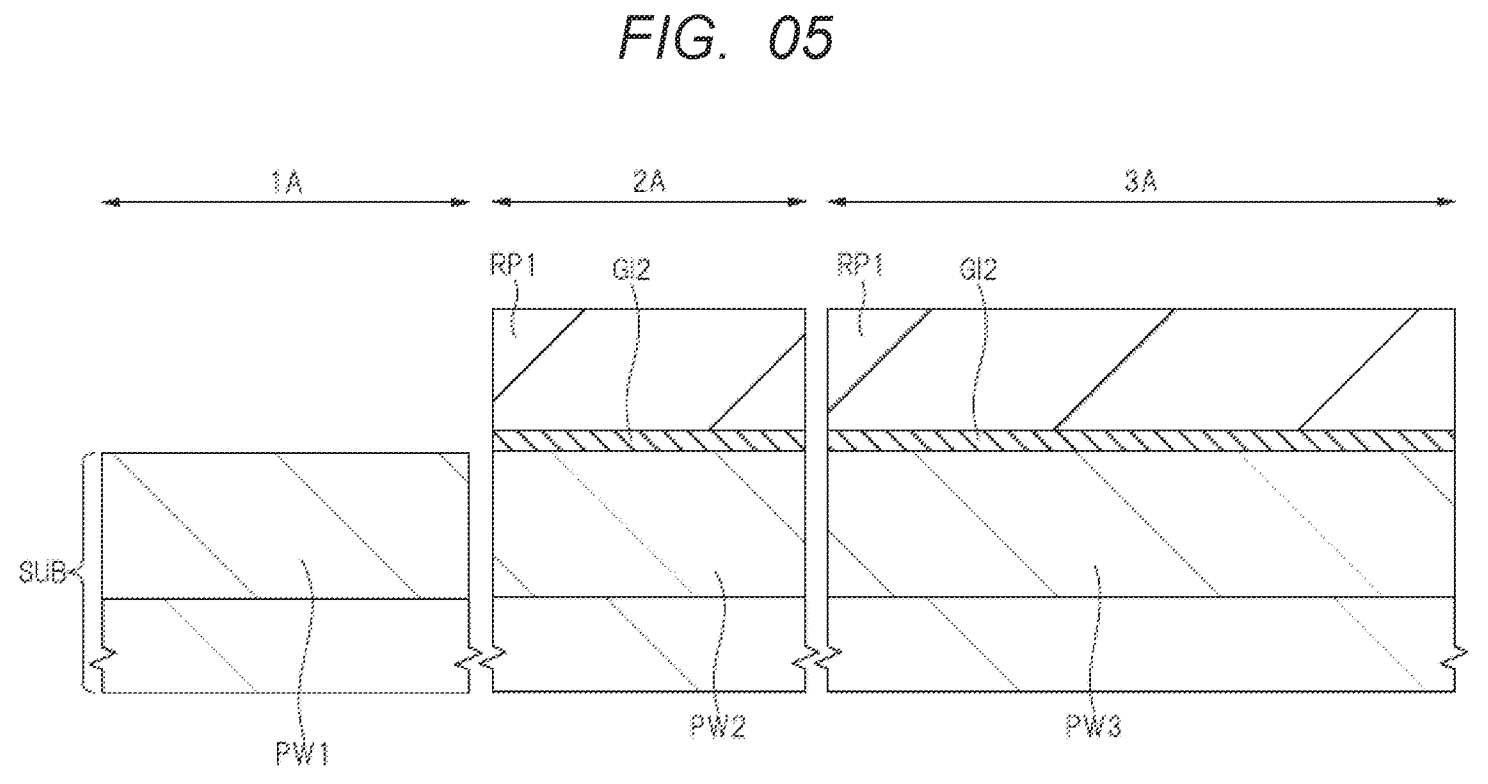

As shown in FIG. 5, the gate dielectric film GI2 in the region 1A is selectively removed. First, a resist pattern RP1 for opening the region 1A is formed on the gate dielectric film GI2 in the region 2A and the region 3A. Next, using the resist pattern RP1 as a mask, a wet etching process using solution containing hydrofluoric acid is performed to remove the gate dielectric film GI2 in the region 1A. Thereafter, the resist pattern RP1 is removed by asking. After etching, the gate dielectric film GI2 is left on the semiconductor substrate SUB in the region 2A and the region 3A.

Figure 6:
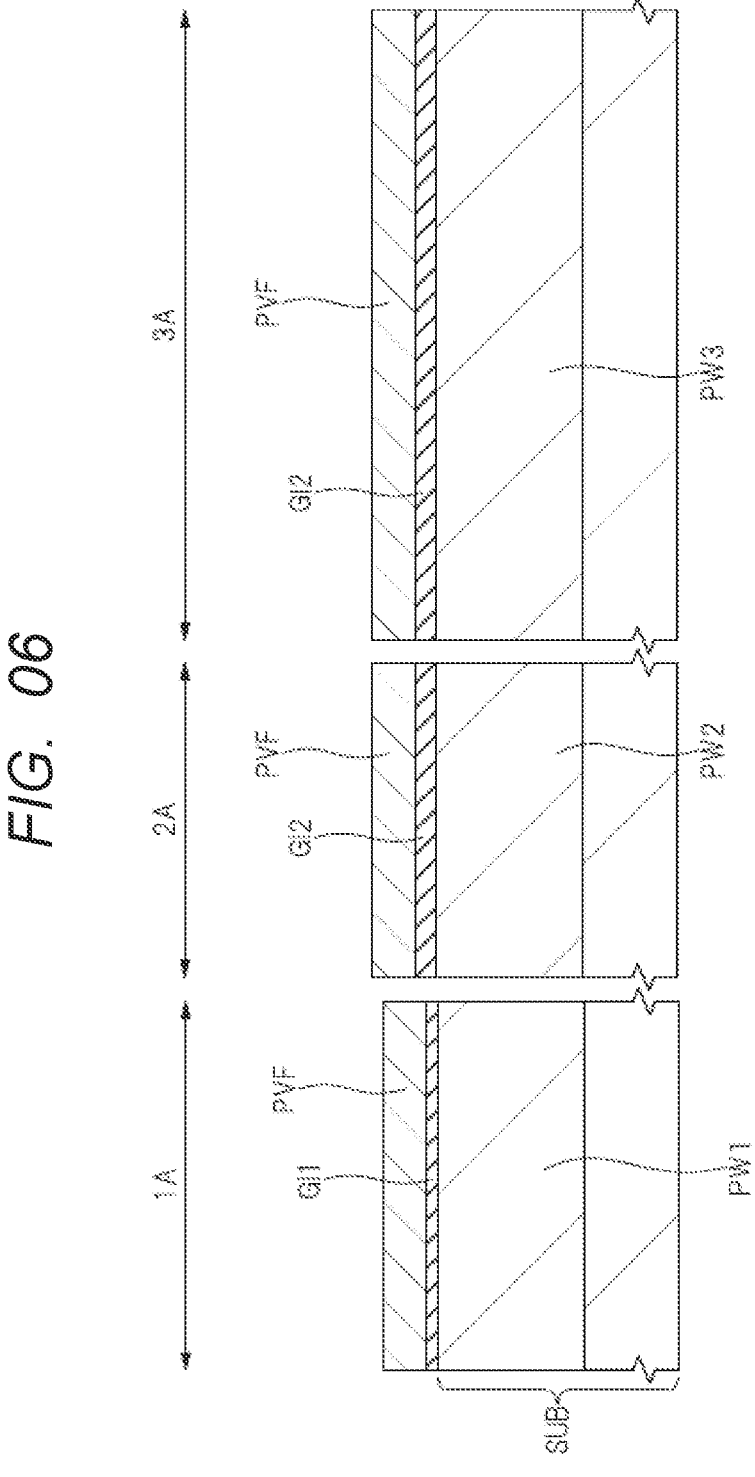
FIG. 6 is a cross-sectional view showing a manufacturing process of the semiconductor device following FIG. 5.

As shown in FIG. 6, the gate dielectric film GI1 having a smaller thickness than the gate dielectric film GI2 is formed on the semiconductor substrate SUB in the region 1A by, for example, a thermal oxidation method. Next, a protective film PVF is formed on the gate dielectric film GI1 in the region 1A, on the gate dielectric film GI2 in the region 2A, and on the gate dielectric film GI2 in the region 3A by, for example, CVD (Chemical Vapor Deposition) method. The protective film PVF is, for example, a conductive film such as a polycrystalline silicon film into which n-type impurities are implanted, or a silicon nitride film. The thickness of the protective film PVF is, for example, 20 nm or more and 50 nm or less.

Figure 7:
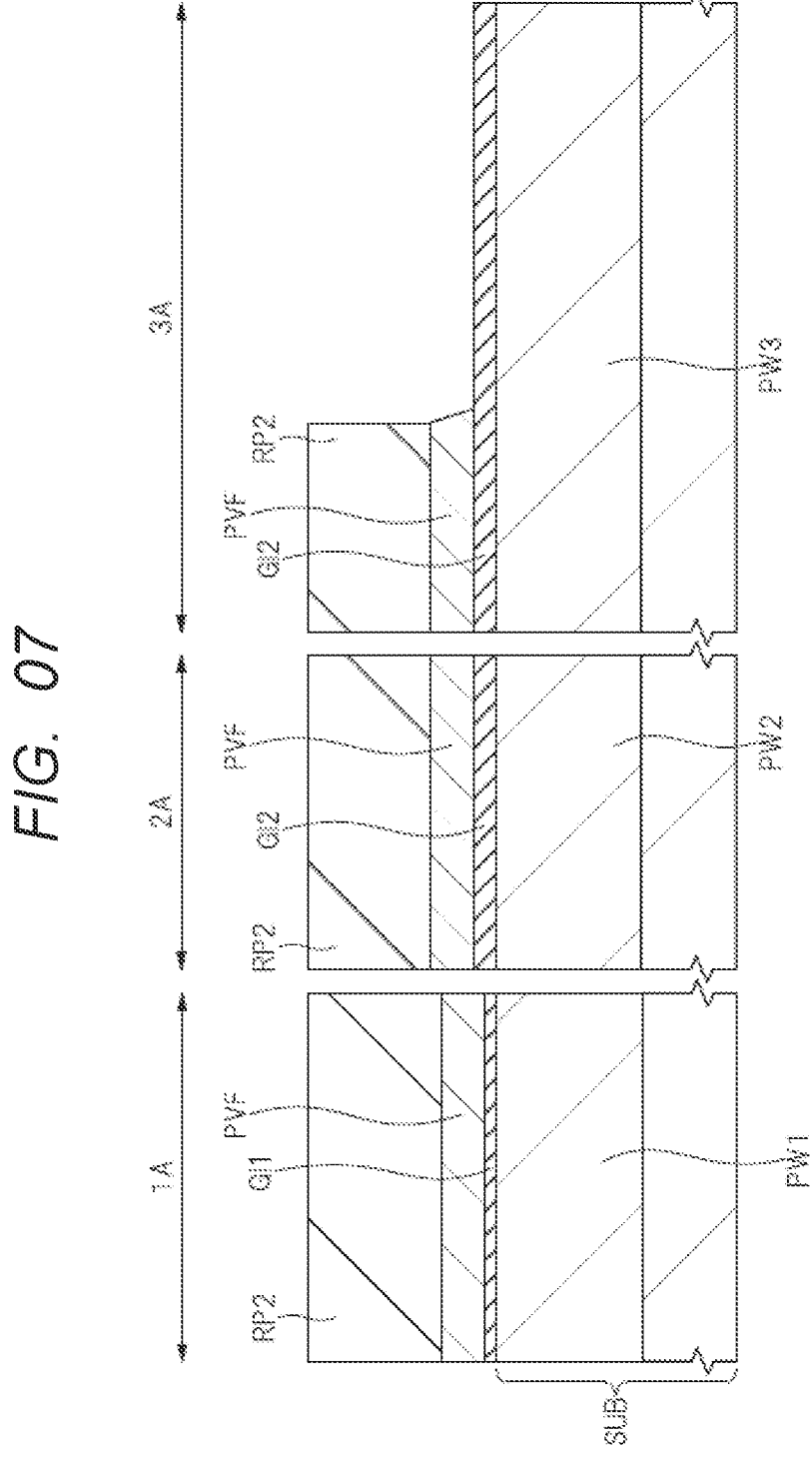
FIG. 7 is a cross-sectional view showing a manufacturing process of the semiconductor device following FIG. 6.

As shown in FIG. 7, the protective film PVF in the region 3A is selectively removed. First, a resist pattern RP2 opening a part of the region 3A is formed on the protective film PVF in the region 1A, the region 2A, and the region 3A. The resist pattern RP2 is formed on the protective film PVF in other parts in the region 1A, the region 2A, and the region 3A. Next, an etching process is performed using the resist pattern RP2 as a mask. Thus, in the region 3A, the protective film PVF is selectively removed such that a part of the protective film PVF is left on the gate dielectric film GI2. Thereafter, the resist pattern RP2 is removed by ashing. The protective film PVF is left on the gate dielectric film GI2 in other parts in the region 1A, the region 2A, and in the region 3A.

Here, when the protective film PVF is a polycrystalline silicon film, the etching process is performed by a dry etching process. When the protective film PVF is a silicon nitride film, the etching process is performed by, for example, chemical dry etching.

Figure 8:
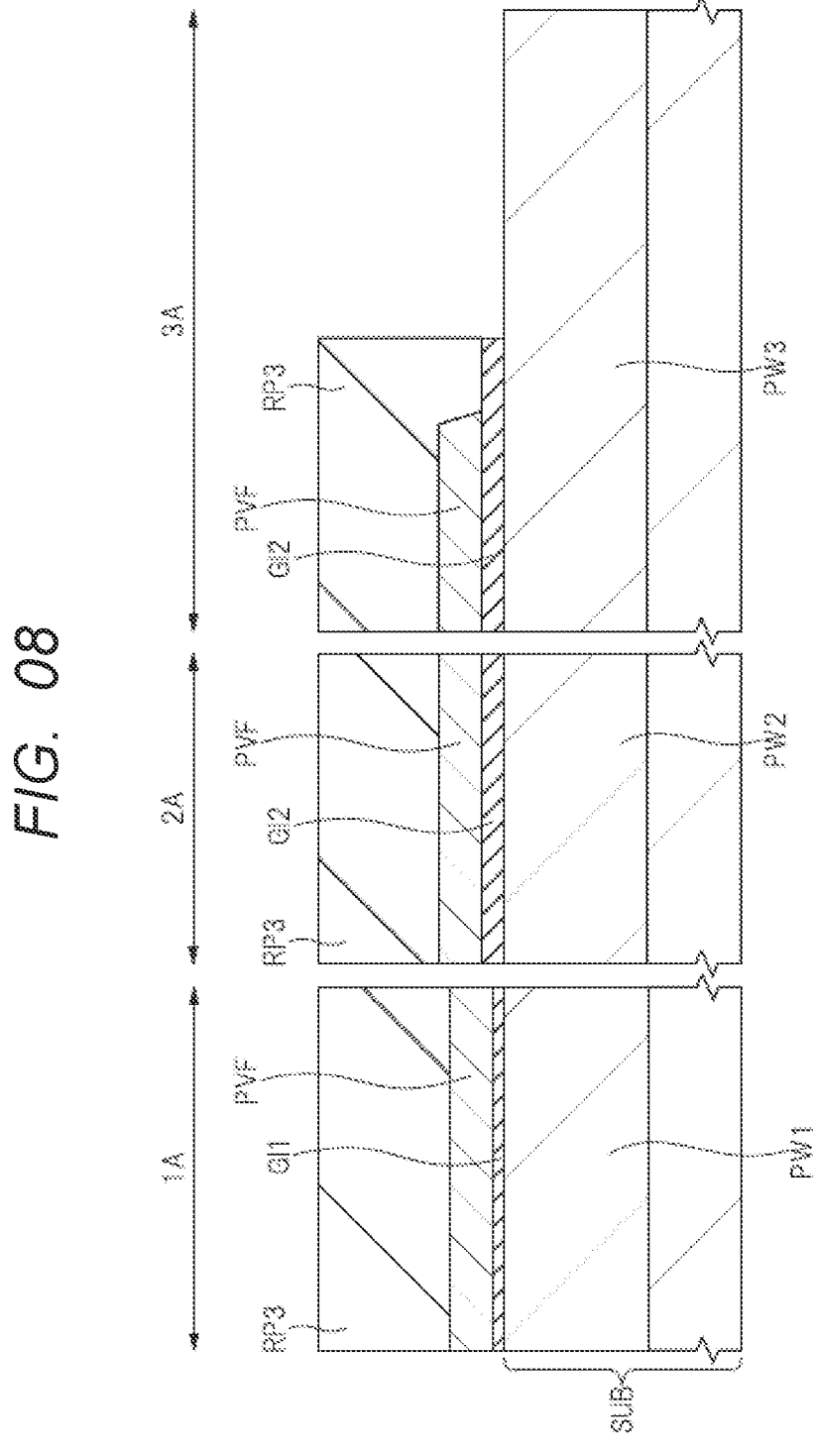
FIG. 8 is a cross-sectional view showing a manufacturing process of the semiconductor device following FIG. 7.

As shown in FIG. 8, the gate dielectric film GI2 in the region 3A is selectively removed. First, a resist pattern RP3 opening a part of the region 3A is formed on the protective film PVF in the region 1A, the region 2A, and the region 3A and on the gate dielectric film GI2 exposed from the protective film PVF in the region 3A. Next, using the resist pattern RP3 as a mask, a wet etching process using solution containing hydrofluoric acid is performed. Thus, in the region 3A, the gate dielectric film GI2 is selectively removed such that the protective film PVF and a part of the gate dielectric film GI2 exposed from the protective film PVF are left. Thereafter, the resist pattern RP3 is removed by ashing.

Figure 9:
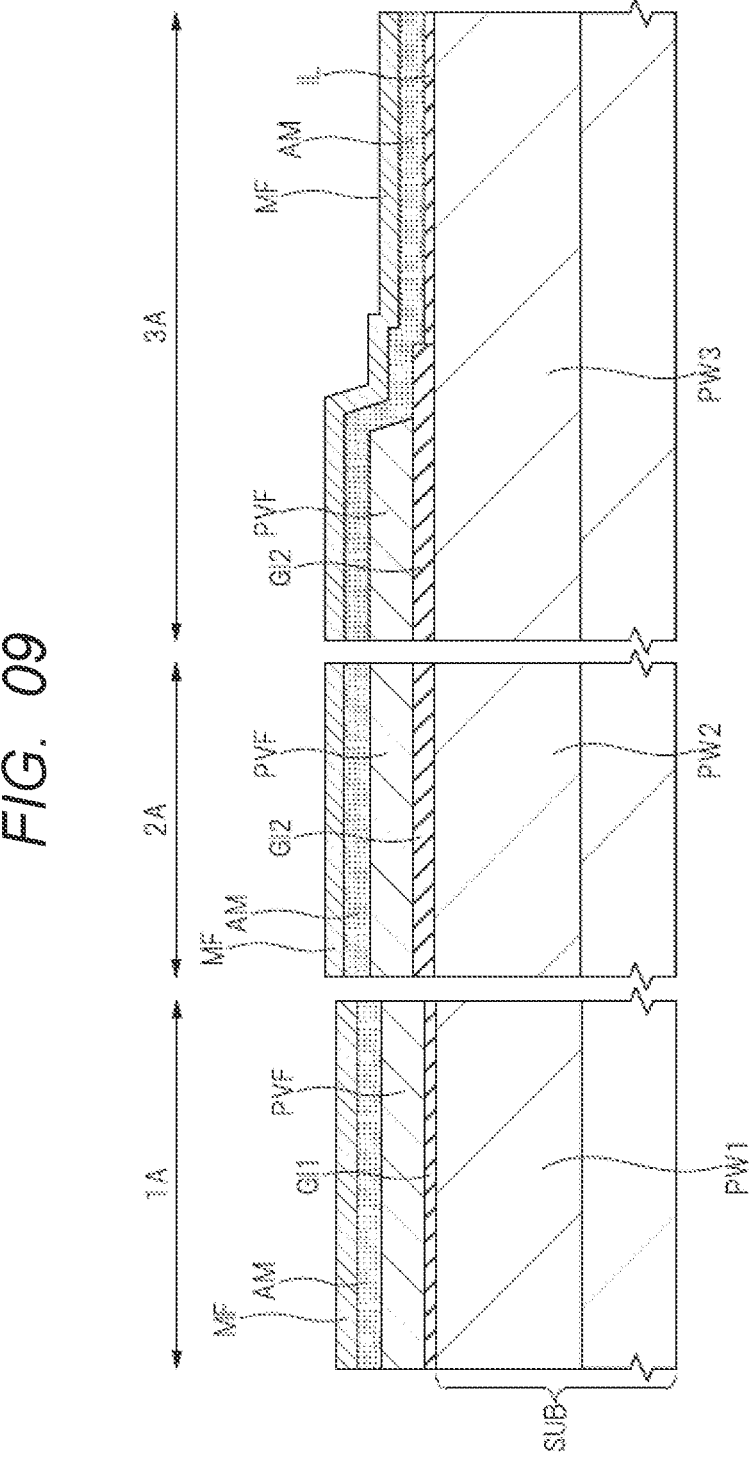
FIG. 9 is a cross-sectional view showing a manufacturing process of the semiconductor device following FIG. 8.

As shown in FIG. 9, a paraelectric film IL having a smaller thickness than the gate dielectric film GI2 is formed on the semiconductor substrate SUB in the region 3A by, for example, a thermal oxidation method.

Next, by, for example, ALD (Atomic Layer Deposition) method, an amorphous film LA is formed on the protective film PVF in the region LA, the region 2A, and the region 3A, the gate dielectric film GI2 exposed from the protective film PVF in the region 3A, and the paraelectric film IL in the region 3A. The amorphous film AM is formed of, for example, a material including a metal oxide and a first element. The metal oxide is, for example, hafnium oxide ($HfO_2$) or gallium oxide ($Ga_2O_3$). The first element is, for example, zirconium (Zr). The first element may be silicon (Si), nitrogen (N), yttrium (Y), germanium (Ge), lanthanum (La), or ytterbium (Yb) instead of zirconium.

Next, a metal film MF is formed on the amorphous film AM in the region 1A, the region 2A, and the region 3A by, for example, CVD method.

Figure 10:
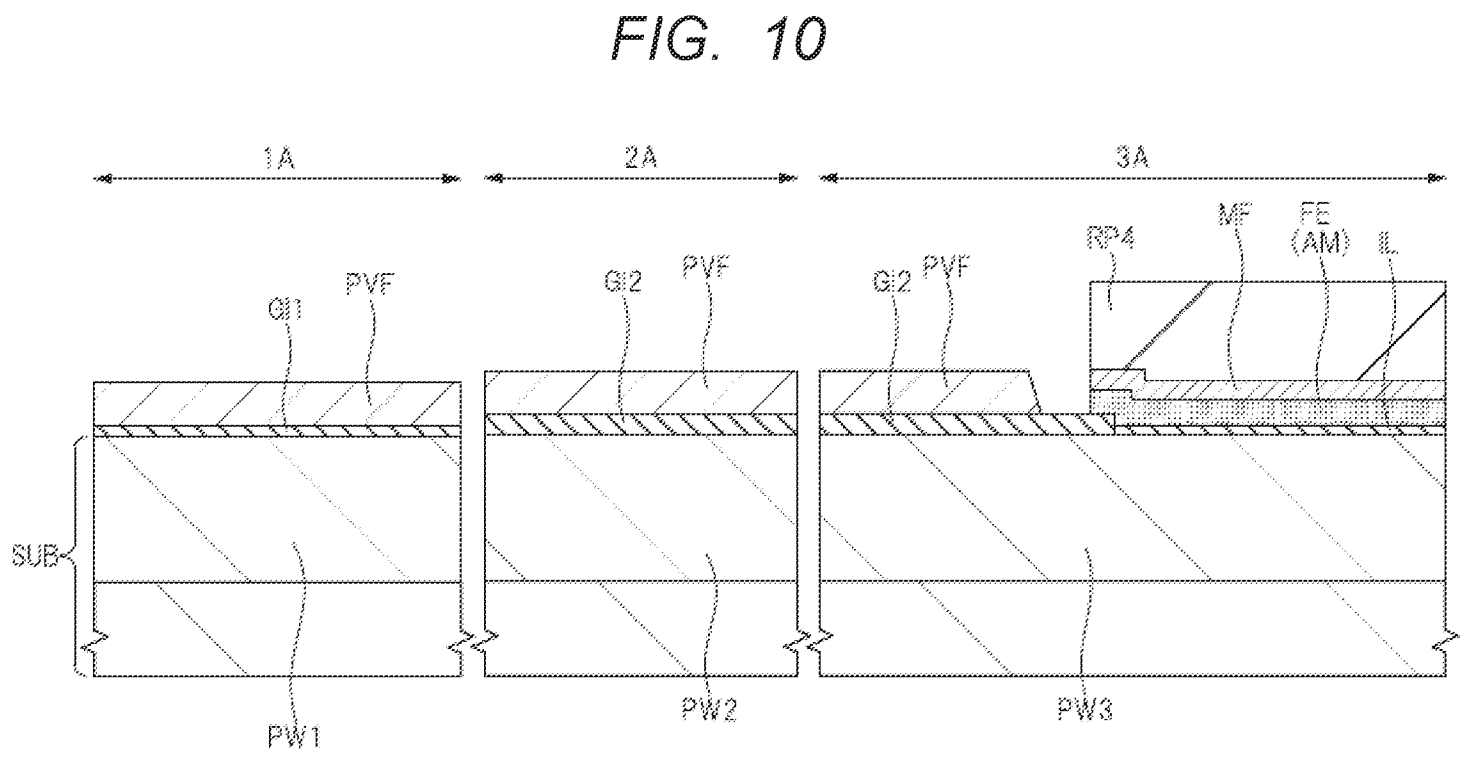

As shown in FIG. 10, by performing a heat treatment, the amorphous film AM is crystallized to form a ferroelectric film FE. The heat treatment is performed by RTA (Rapid Thermal Annealing) method at 600° C. or lower. However, the heat treatment is preferably performed using, for example, microwaves having a frequency 1 GHz or higher and a 10 GHz or lower, and more preferably performed using microwaves having a frequency 2.45 GHz. The heat treatment using microwaves can be performed at a low temperature, for example, at a temperature of 400° C. or lower.

In this crystallization step, the orientation of the ferroelectric film FE is controlled by the stresses from the metal film MF. That is, when the amorphous film AM is crystallized to the ferroelectric film FE, the metal film MF has a function of orienting the crystalline phase of the ferroelectric film FE to be an orthorhombic crystal.

Next, a resist pattern RP4 opening the region LA, the region 2A, and a part of the region 3A is formed on the metal film MF in the region 3A. Next, dry etching is performed using the resist pattern RP4 as a mask. Accordingly, the metal film MF and the ferroelectric film FE are selectively removed in the region LA, the region 2A, and a part of the region 3A.

Here, in the region 3A, the metal film MF and the ferroelectric film FE are selectively removed such that a part of each of the metal film MF and the ferroelectric film FE is left on a part of the gate dielectric film GI2 exposed from the protective film PVF and on the paraelectric film IL. That is, in the region 3A, a part of each of the metal film MF and the ferroelectric film FE is left such that the metal film MF and the ferroelectric film FE do not cover the protective film PVF. An end portion of a part of each of the metal film MF and the ferroelectric film FE is located on the gate dielectric film GI2 between the protective film PVF and the paraelectric film IL.

Figure 11:
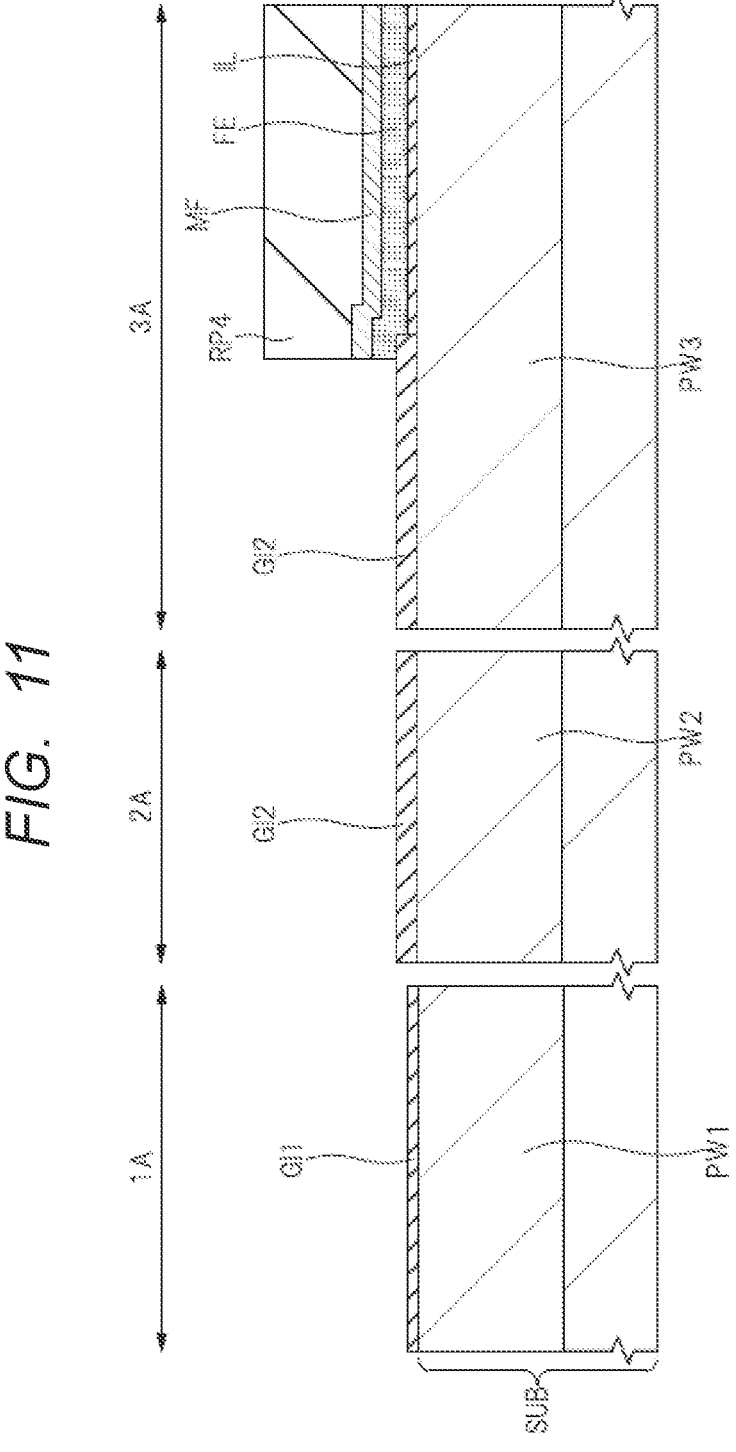
FIG. 11 is a cross-sectional view showing a manufacturing process of the semiconductor device following FIG. 10.

As shown in FIG. 11, the protective film PVF in the region LA, the region 2A, and the region 3A is selectively removed by an etching process. The etching process is performed in a state which the resist pattern RP4 is formed. Here, when the protective film PVF is a polycrystalline silicon film, the etching process is performed by a dry etching process. When the protective film PVF is a silicon nitride film, the etching process is performed by a wet etching process using a solution containing phosphoric acid. Thereafter, the resist pattern RP4 is removed by asking.

Figure 12:
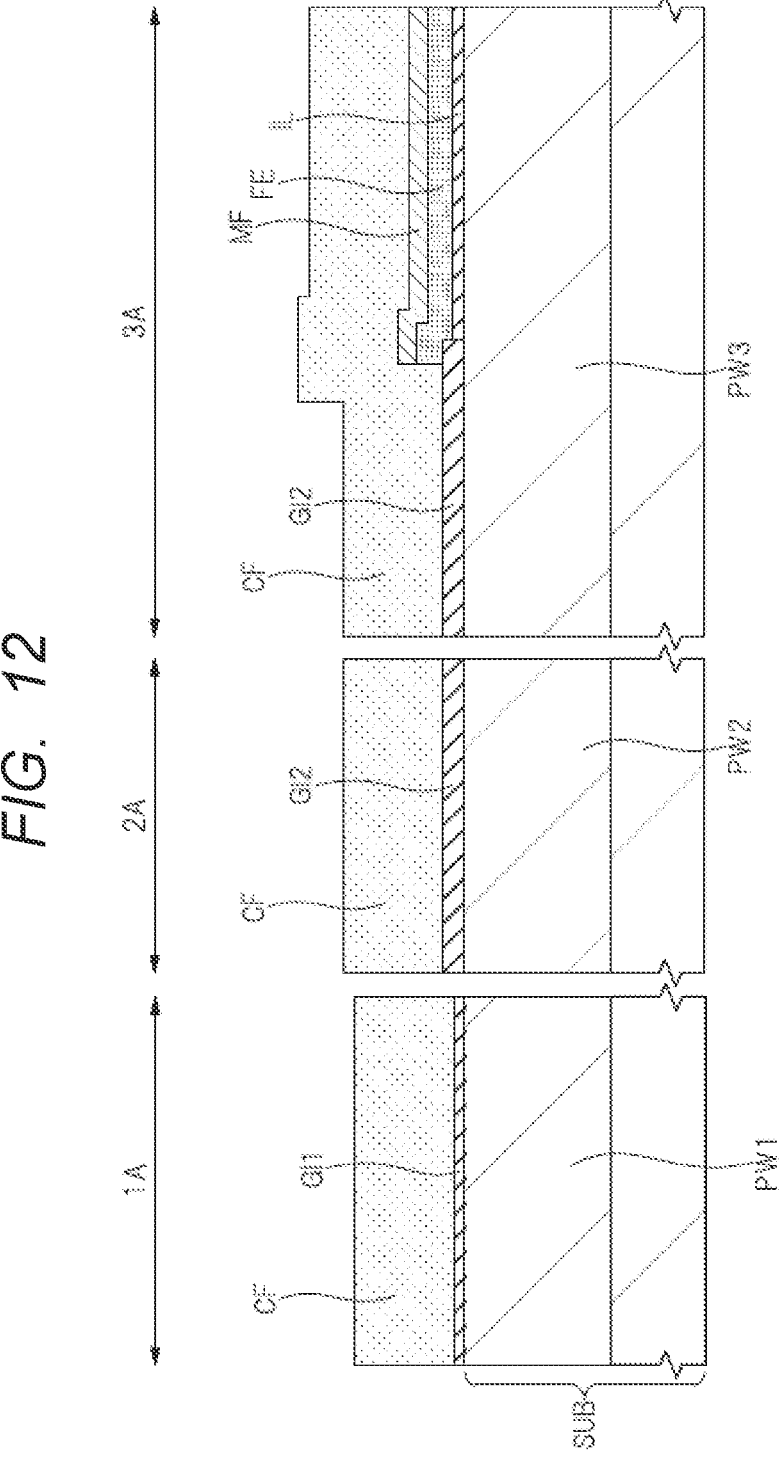
FIG. 12 is a cross-sectional view showing a manufacturing process of the semiconductor device following FIG. 11.

As shown in FIG. 12, a conductive film CF is formed on the gate dielectric film GI1 in the region LA, the gate dielectric film GI2 in the region 2A, the gate dielectric film GI2 in the region 3A, and the metal film MF in the region 3A by, for example, CVD method. The conductive film CF is, for example, a polycrystalline silicon film in which n-type impurities are implanted.

Figure 13:
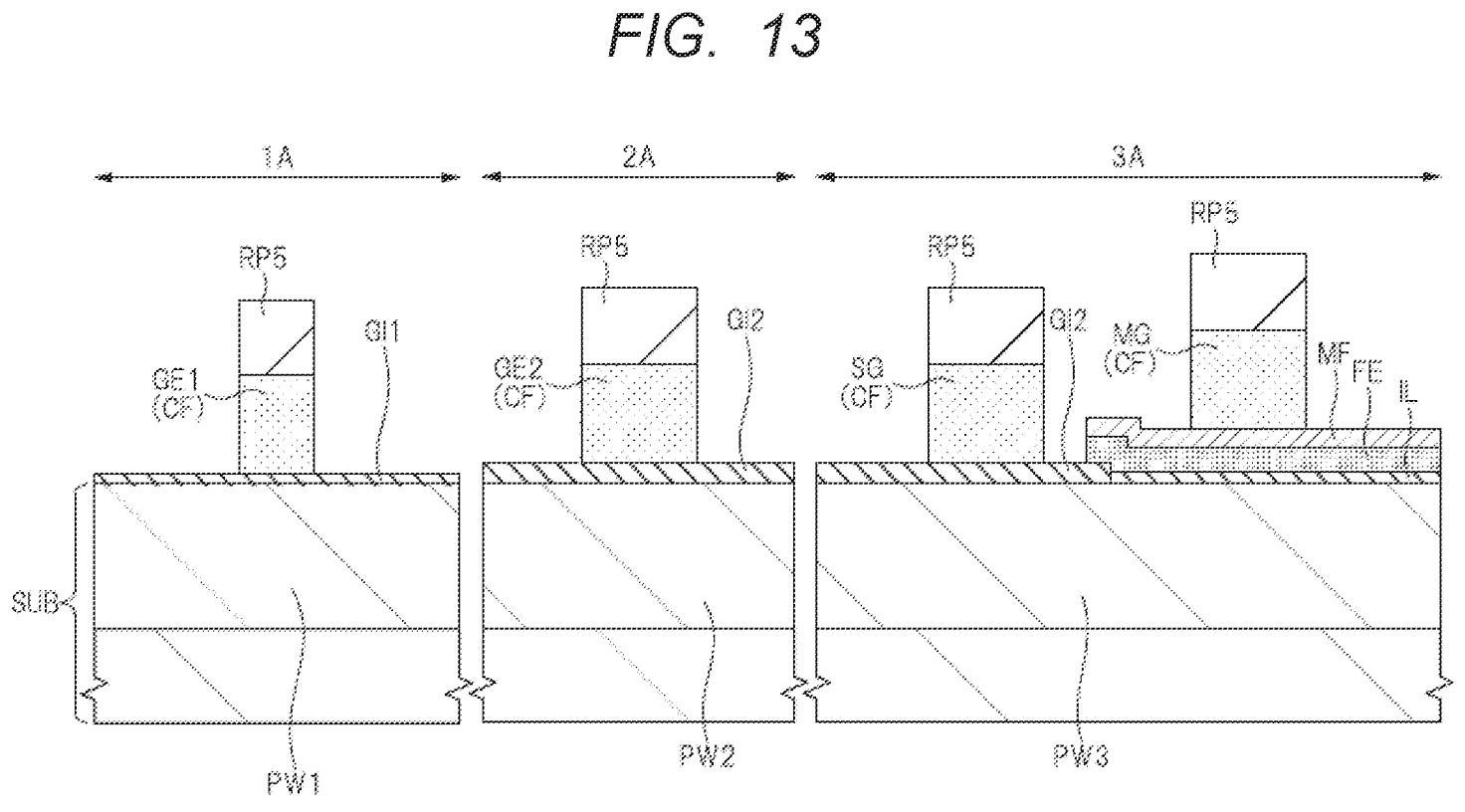

As shown in FIG. 13, a resist pattern RP5 opening a part of each of the region 1A, the region 2A, and the region 3A is formed on the conductive film CF in the region LA, the region 2A, and the region 3A. Next, a part of the conductive film CF is removed by performing a dry etching using the resist pattern RP5 as a mask.

As described above, by patterning the conductive film CF, the gate electrode GE1 is formed on the gate dielectric film GI1 in the region 1A, the gate electrode GE2 is formed on the gate dielectric film GI2 in the region 2A, the select gate electrode SG is formed on the gate dielectric film GI2 in the region 3A, and the memory gate electrode MG is formed on the metal film MF in the region 3A. Thereafter, the resist pattern RP5 is removed by asking.

Figure 14:
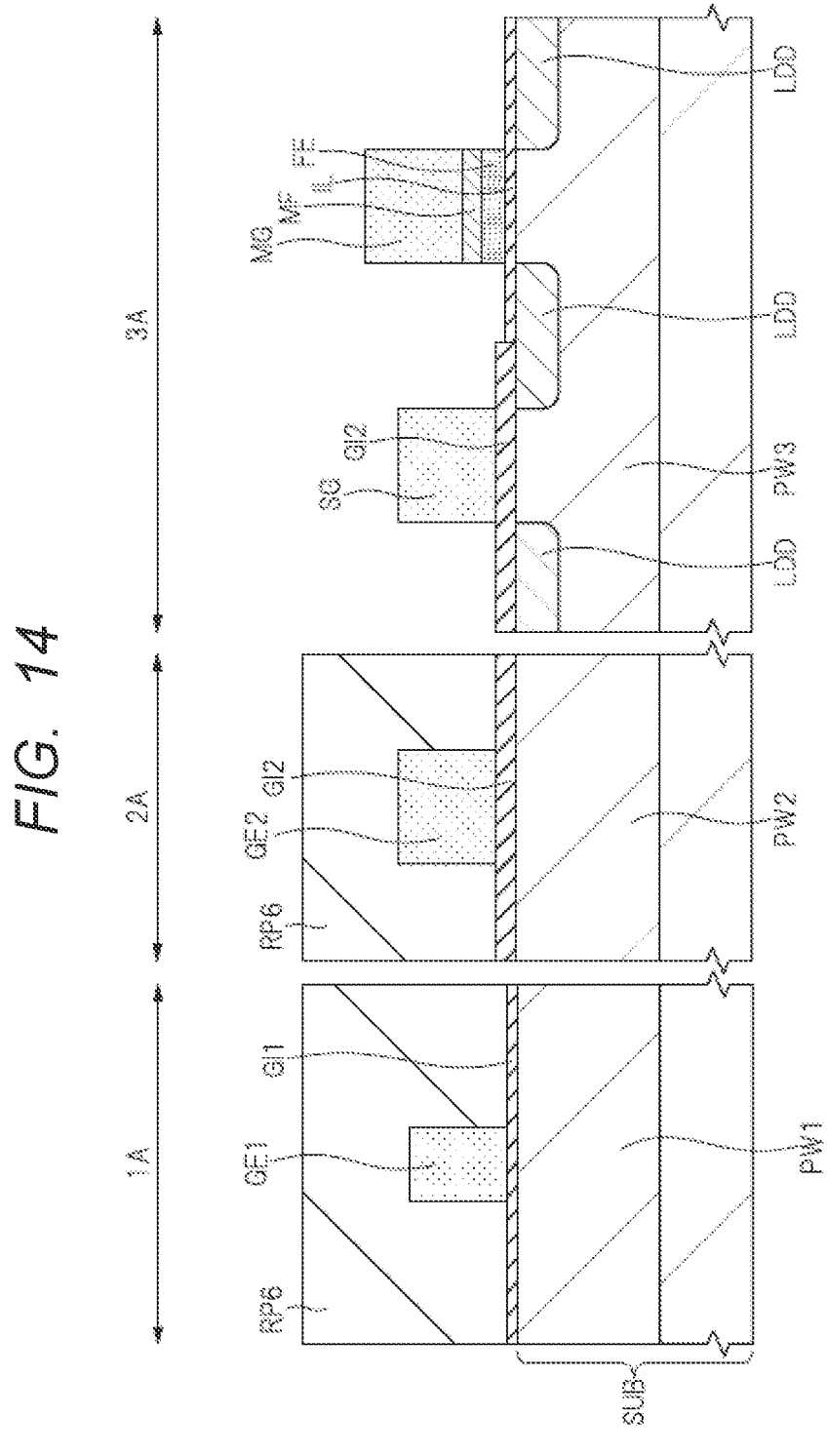
FIG. 14 is a cross-sectional view showing a manufacturing process of the semiconductor device following FIG. 13.

As shown in FIG. 14, a resist pattern RP6 opening the region 3A is formed. By performing a dry etching process in a state where the gate electrodes GE1, GE2 in the region LA and the region 2A and the gate dielectric films GI1, GI2 are covered with the resist pattern RP6, the metal film MF and the ferroelectric film FE exposed from the memory gate electrode MG in the region 3A are removed. At this time, the gate dielectric film GI2 in the region 3A is exposed to the dry etching process, and the thickness of the gate dielectric film GI2 is reduced, but the semiconductor substrate SUB is not exposed.

Next, an n-type low concentration region LDD in the region 3A is formed in the semiconductor substrate SUB exposed from the select gate electrode SG and the memory gate electrode MG by ion implantation method. Since a step of removing the metal film MF and the ferroelectric film FE and a step of forming the low concentration region LDD in the region 3A can be performed using the same resist pattern RP6, the manufacturing process can be simplified. Thereafter, the resist pattern RP6 is removed by ashing.

Figure 15:
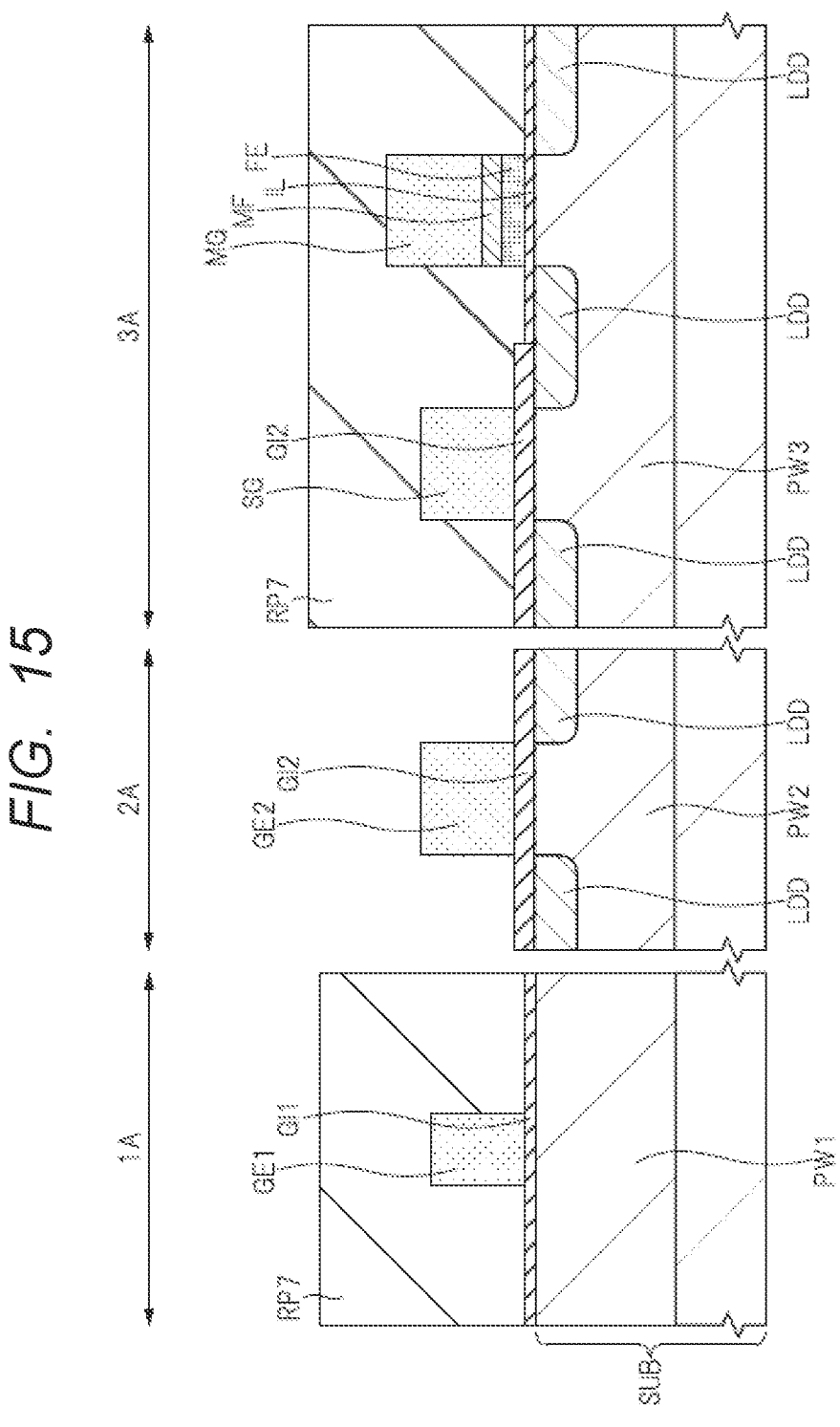
FIG. 15 is a cross-sectional view showing a manufacturing process of the semiconductor device following FIG. 14.

As shown in FIG. 15, a resist pattern RP7 opening the region 2A is formed. Next, by ion implantation into the semiconductor substrate SUB exposed from the gate electrode GE2 in a state where the region LA and the region 3A are covered with the resist pattern RP7, an n-type low concentration region LDD in the region 2A is formed. Thereafter, the resist pattern RP7 is removed by ashing.

Figure 16:
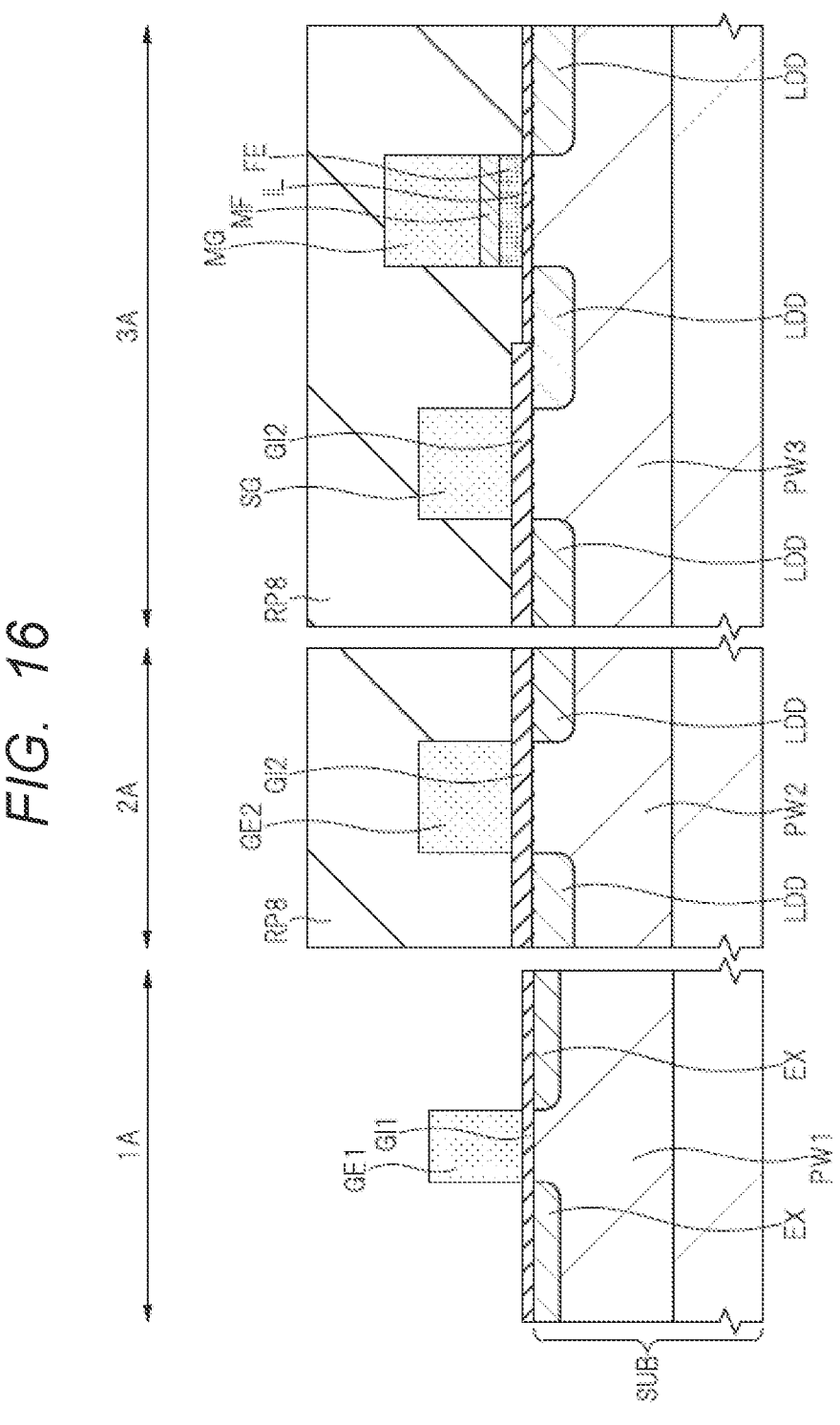
FIG. 16 is a cross-sectional view showing a manufacturing process of the semiconductor device following FIG. 15.

As shown in FIG. 16, a resist pattern RP8 opening the region LA is formed. Next, by ion implantation into the semiconductor substrate SUB exposed from the gate electrode GE1 in a state where the region 2A and the region 3A are covered with the resist pattern RP8, an n-type extension region EX is formed. Thereafter, the resist pattern RP8 is removed by asking. Note that the gate dielectric film GI1, the gate dielectric film GI2, and the paraelectric film IL exposed from the gate electrode GE1, the gate electrode GE2, the select gate electrode SG, and the memory gate electrode MG may be subjected to a wet etching process using solution containing hydrofluoric acid to remove them.

Figure 3:
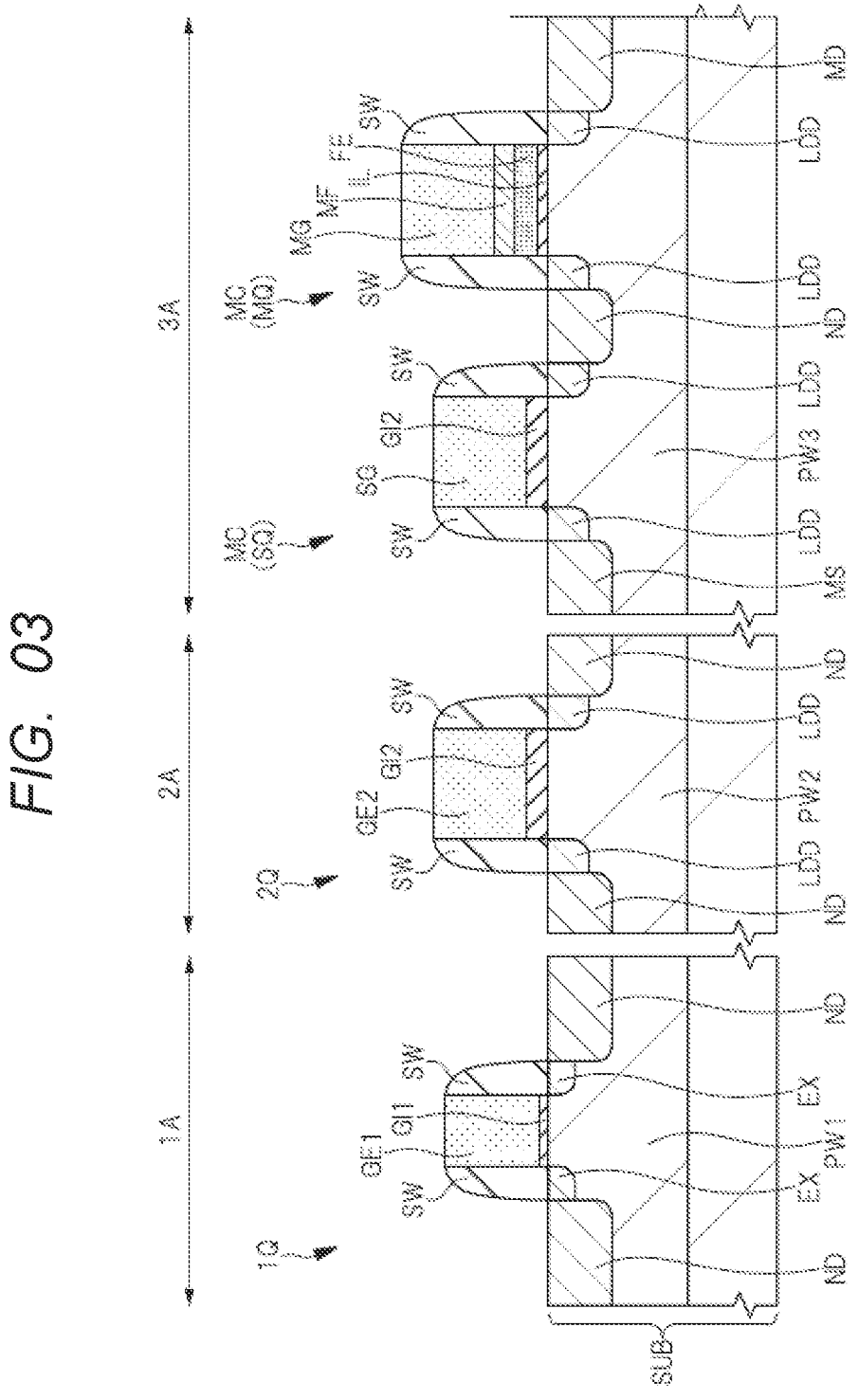
FIG. 3 is a cross-sectional view showing the semiconductor device in the first embodiment.

Thereafter, the semiconductor device 100 including the low withstand voltage MOSFET1Q, the high withstand voltage MOSFET2Q, and the ferroelectric memory cell MC shown in FIG. 3 are manufactured through the following steps.

First, a silicon oxide film and a silicon nitride film are sequentially formed, for example, by a CVD method so as to cover the gate electrode GE1, the gate electrode GE2, the select gate electrode SG, and the memory gate electrode MG. Next, the silicon oxide film and the silicon nitride film are processed by anisotropic etching. Accordingly, a sidewall spacer SW formed of a laminated film of a silicon oxide film and a silicon nitride film is formed on a side surface of each of the gate electrode GE1, the gate electrode GE2, the select gate electrode SG, and the memory gate electrode MG.

Next, a diffusion region ND, which is an n-type impurity region, is formed in the semiconductor substrate SUB exposed from the sidewall spacer SW in the region 1A, the region 2A, and the region 3A by photolithography technique and ion implantation method. In the region 3A, a part of the diffusion region ND is shown as the source region MS and the drain region MD.

Thereafter, if desired, silicide layers such as cobalt silicide, nickel silicide, or nickel platinum silicide may be formed on the gate electrode GE1, the gate electrode GE2, the select gate electrode SG, the memory gate electrode MG, the diffusion region ND, the source region MS, and the drain region MD by a salicide (Salicide: Self Aligned Silicide) technique.

Main Features of First Embodiment Compared to First Examined Example

A method of manufacturing the semiconductor device in the first examined example studied by the inventors of the present application will be described below.

Figure 29:
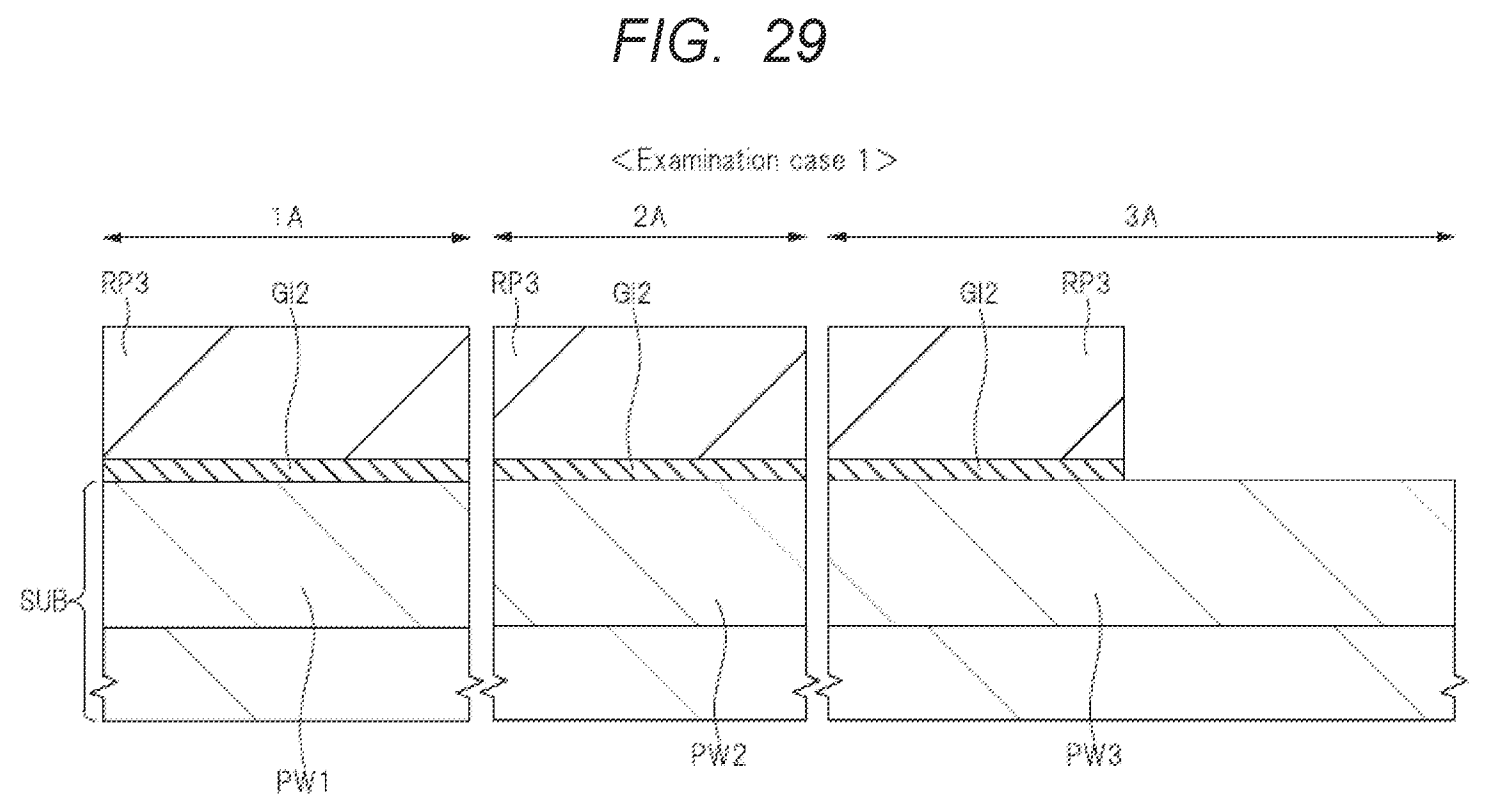

FIG. 29 to FIG. 33 are cross-sectional views each showing a method of manufacturing the semiconductor device in the first examined example. The manufacturing process of the first examined example is the same as that of the first embodiment until FIG. 4. FIG. 29 shows the manufacturing process following FIG. 4.

In the first examined example, first, as shown in FIG. 29, the gate dielectric film GI2 formed in a region where the memory transistor MQ is formed in the region 3A is removed using the resist pattern RP3 as a mask. Thereafter, the resist pattern RP3 is removed by asking.

Figure 30:
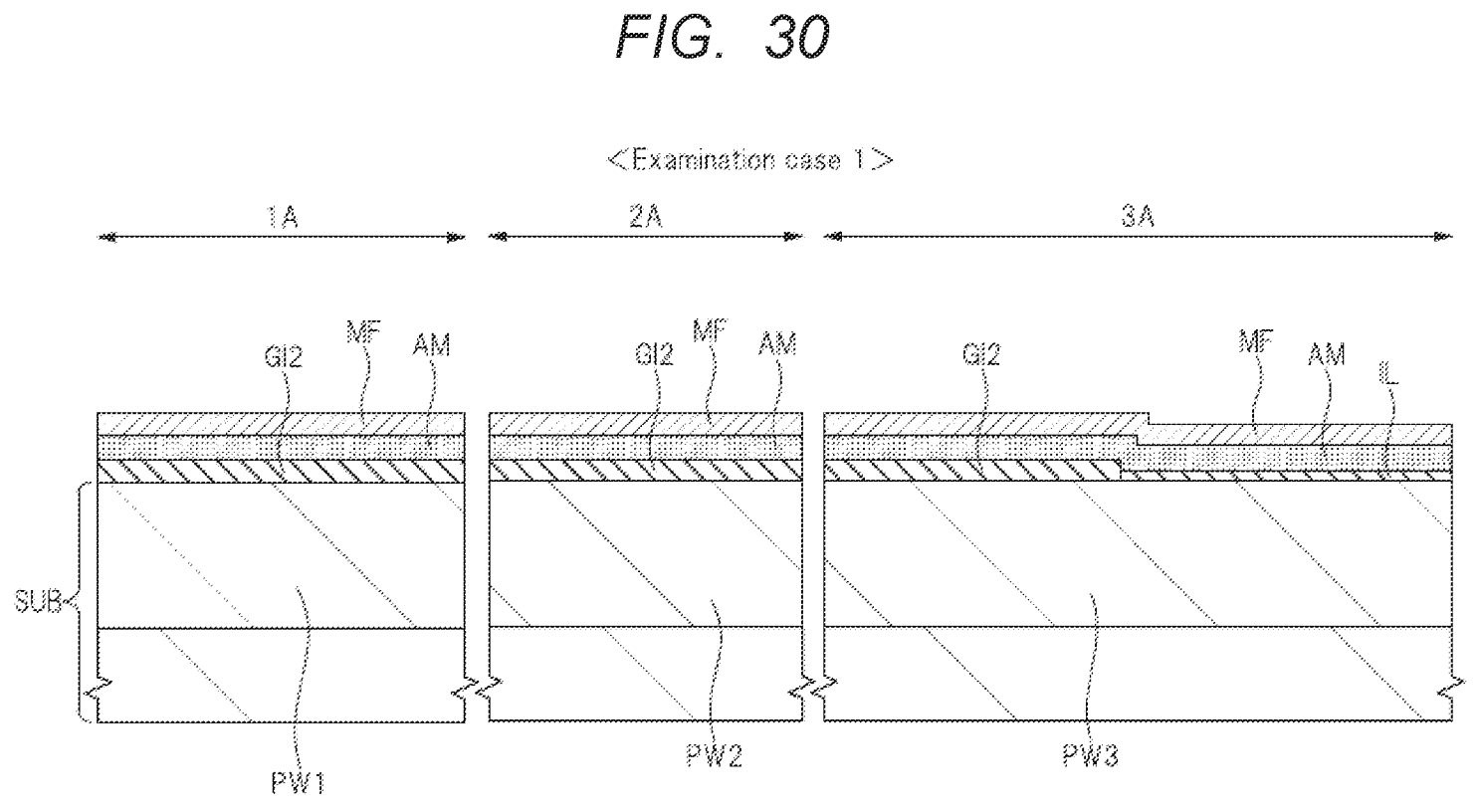

As shown in FIG. 30, a paraelectric film IL is formed on the semiconductor substrate SUB in the region 3A. Next, an amorphous film AM is formed on the gate dielectric film GI2 in the region LA, the region 2A, and the region 3A and on the paraelectric film IL in the region 3A. Next, a metal film MF is formed on the amorphous film AM in the region LA, the region 2A, and the region 3A.

Next, by performing a heat treatment, the amorphous film AM is crystallized to form a ferroelectric film FE.

Figure 31:
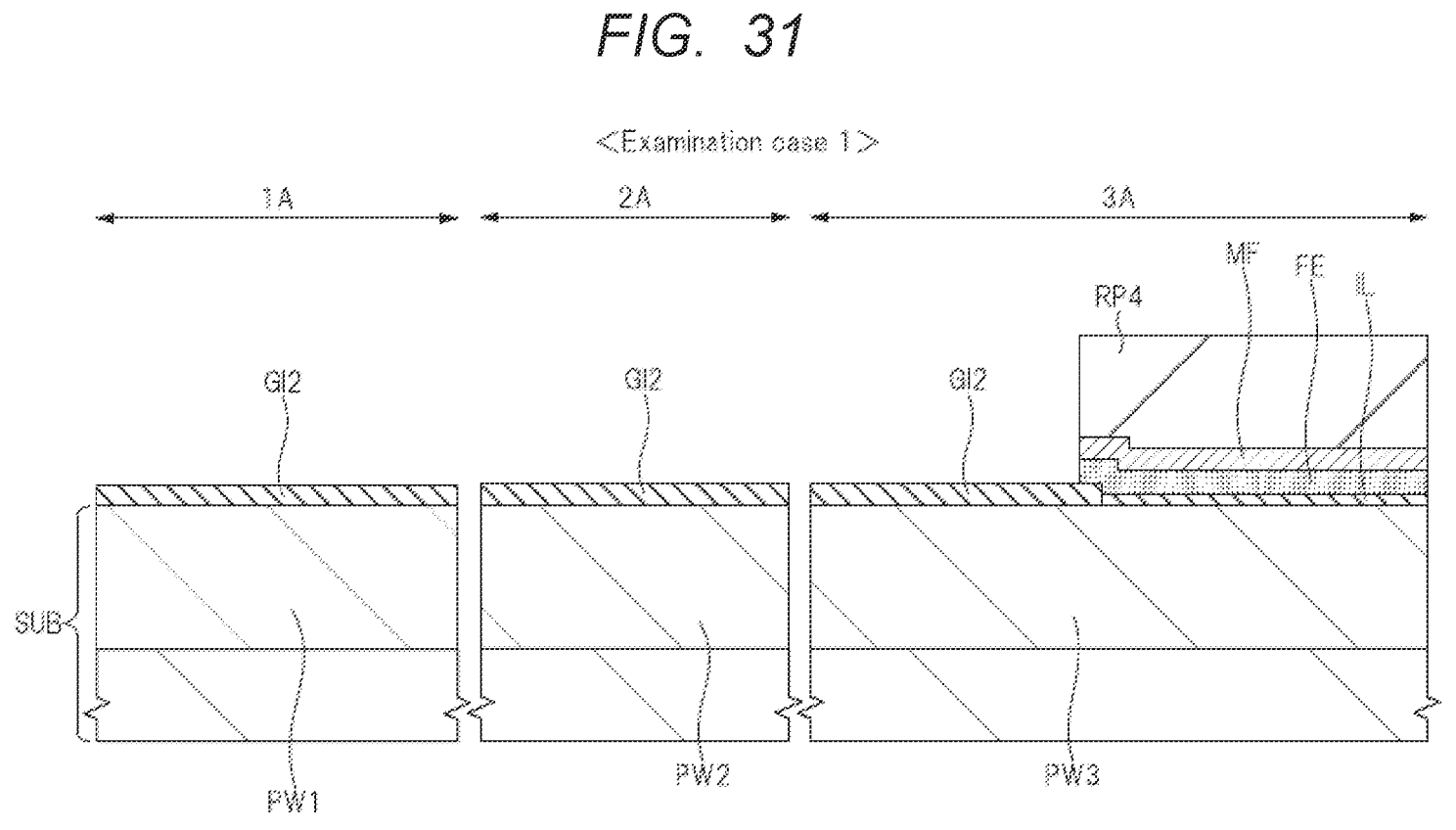

As shown in FIG. 31, the metal film MF and the ferroelectric film FE are patterned by dry etching using the resist pattern RP4 as a mask. Accordingly, the metal film MF and the ferroelectric film FE in the region LA and the region 2A are selectively removed. In the region 3A, the metal film MF and the ferroelectric film FE are selectively removed such that a part of each of the metal film MF and the ferroelectric film FE is left on a part of the gate dielectric film GI2 and the paraelectric film IL. Thereafter, the resist pattern RP4 is removed by asking.

Here, it is known that it is difficult to remove the ferroelectric film FE crystallized by the heat treatment by the wet etching treatment. Therefore, in order to remove the ferroelectric film FE, a dry etching process is generally used. However, even in the dry etching process, it is difficult to remove the crystallized ferroelectric film FE in a short time, and the etching process time becomes long.

In the first examined example, during the step of removing the ferroelectric film FE, the gate dielectric films GI2 in the region 2A and the region 3A are subjected to a dry etching process. Therefore, even if the dry etching process is performed at a certain selectivity, the thickness of the gate dielectric film GI2 tends to be reduced when the etching process is performed for a long time. The gate dielectric films GI2 in the region 2A and the region 3A are used for the high withstand voltage MOSFET2Q and the select transistor SQ. Therefore, when the thicknesses vary, the desired properties required for the high withstand voltage MOSFET2Q and the select transistor SQ vary.

In order to suppress such a problem, it is conceivable to first pattern the metal film MF and the amorphous film AM, and then crystallize the amorphous film AM to form the ferroelectric film FE. The time for removing the amorphous film AM by the dry etching process is shorter than the time for removing the ferroelectric film FE by the dry etching process. Therefore, since the time for etching process can be shortened, the reduce of the thickness of the gate dielectric film GI2 can be suppressed to some extent.

However, in the crystallization step, the orientation of the ferroelectric film FE is controlled by the stresses from the metal film MF. Therefore, stresses from the metal film MF to the ferroelectric film FE are insufficient when the metal film MF is patterned together with the amorphous film AM and the area of the metal film MF in the wafer surface is reduced. Therefore, it is difficult to efficiently crystallize the entire ferroelectric film FE.

Figure 32:
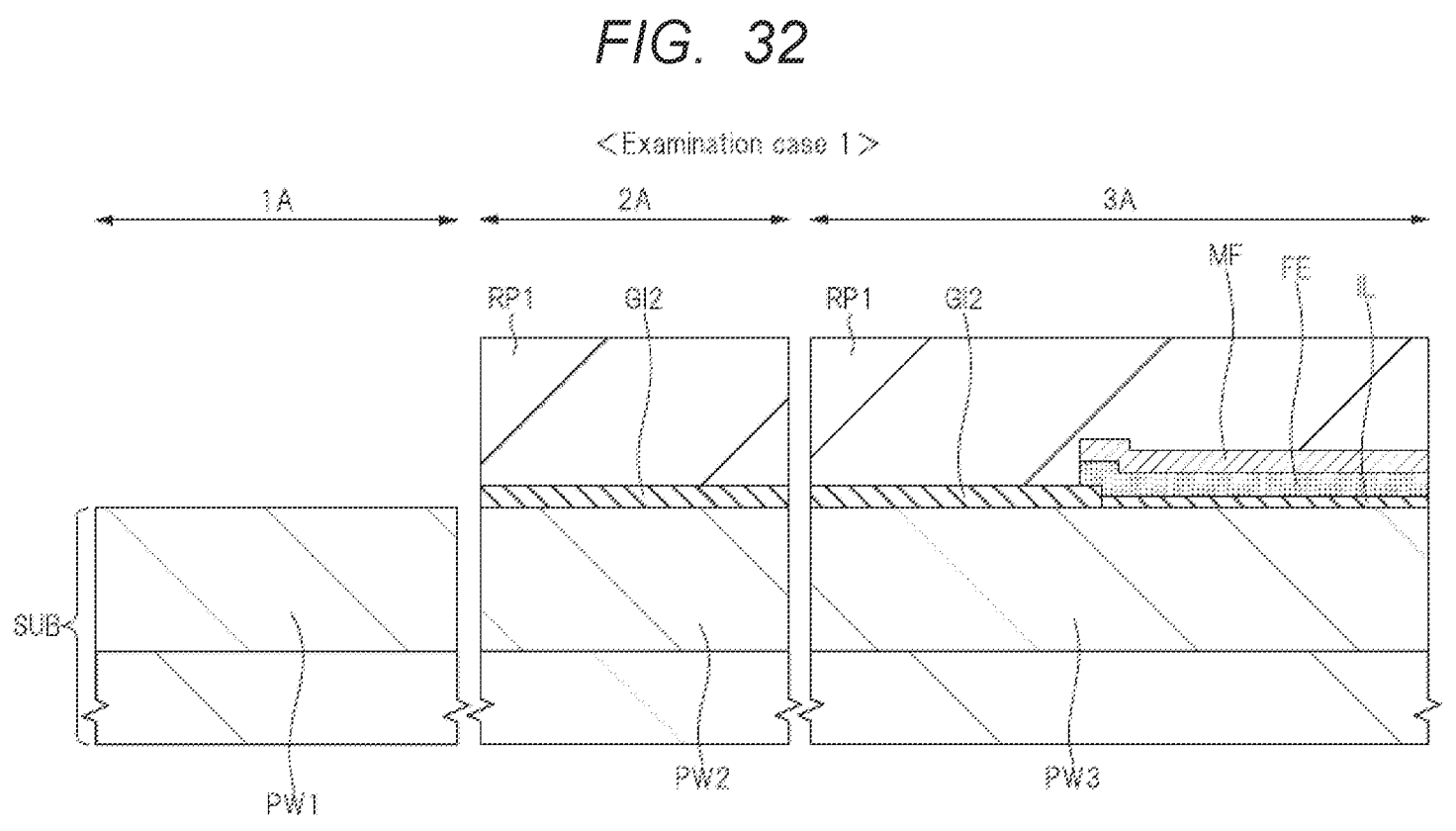

After the manufacturing process of FIG. 31, the manufacturing process of FIG. 32 is performed. As shown in FIG. 32, the gate dielectric film GI2 in the region 1A is removed using the resist pattern RP1 as a mask. Thereafter, the resist pattern RP1 is removed by asking.

Figure 33:
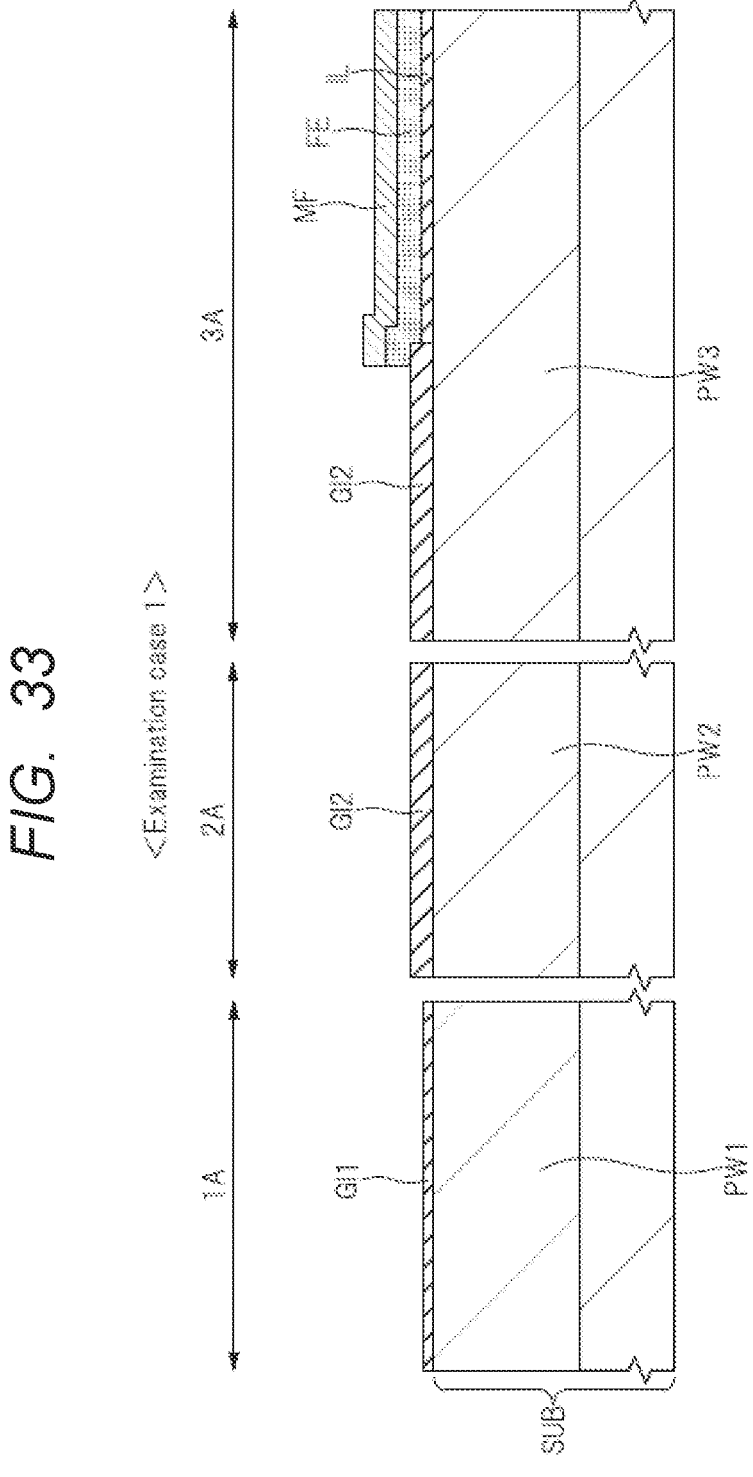
FIG. 33 is a cross-sectional view showing a manufacturing process of the semiconductor device following FIG. 32.

As shown in FIG. 33, the gate dielectric film GI1 is formed on the semiconductor substrate SUB in the region LA by a thermal oxidation method. That is, in the first examined example, the gate dielectric film GI1 is formed after the paraelectric film IL is formed. Therefore, when the gate dielectric film GI1 is oxidized, the paraelectric film IL is also slightly oxidized, and the thickness of the paraelectric film IL is easily increased. Therefore, the characteristics of the memory transistor MQ vary.

For these problems, in the first embodiment, as shown in FIG. 10, when the ferroelectric film FE is removed by the dry etching process, the gate dielectric film GI1 in the region LA and the gate dielectric film GI2 in the region 2A and the region 3A are covered with the protective film PVF. Therefore, if the thickness of the protective film PVF is sufficiently thick, it is possible to prevent the thickness of each of the gate dielectric film GI1 and the gate dielectric film GI2 from being reduced even if the dry etching process is performed for a long time. Therefore, it is possible to solve the problem that the characteristics of each of the low withstand voltage MOSFET1Q, the high withstand voltage MOSFET2Q, and the select transistor SQ vary, and thus it is possible to improve the reliability of the semiconductor device 100.

Further, in the first embodiment, as shown in FIG. 4 to FIG. 9, since the paraelectric film IL is formed after the gate dielectric film GI2 and the gate dielectric film GI1 are formed, the problem that the thickness of the paraelectric film IL is easily increased can be solved, and the problem that the characteristics of the memory transistor MQ fluctuate can be solved.

Figure 17:
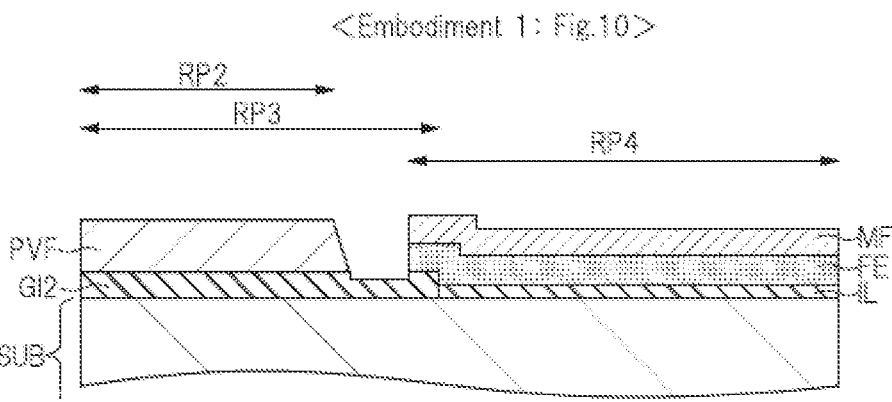
FIG. 17 is a main part cross-sectional view showing the ferroelectric memory cell during a manufacturing process in the first embodiment.
Figure 18:
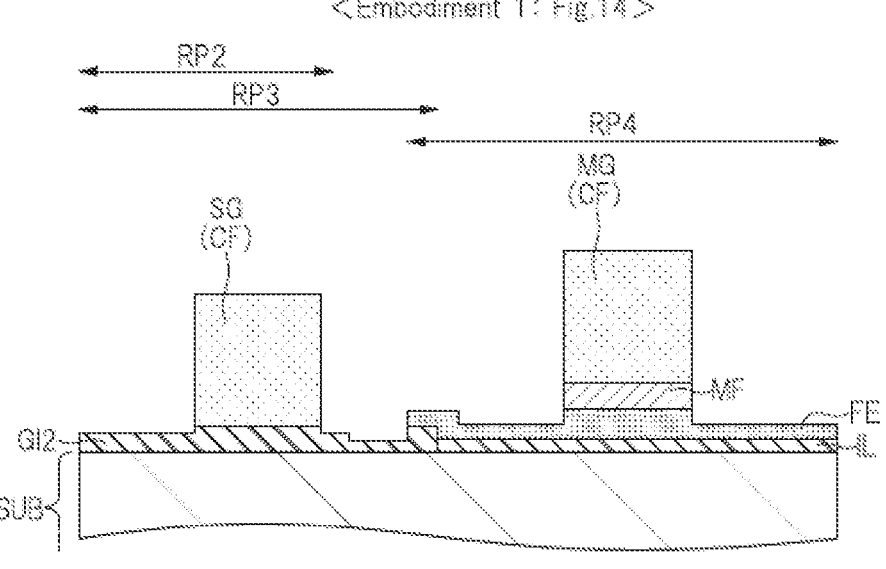
FIG. 18 is a main part cross-sectional view showing the ferroelectric memory cell during a manufacturing process in the first embodiment.
Figure 34:
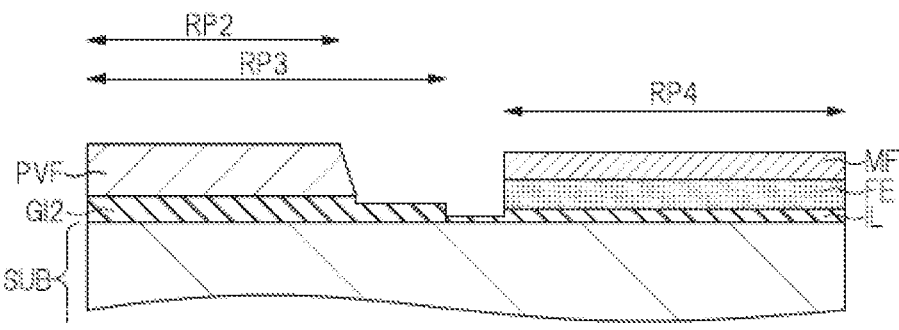
FIG. 34 is a main part cross-sectional view showing the ferroelectric memory cell during a manufacturing process in a second examined example.
Figure 35:
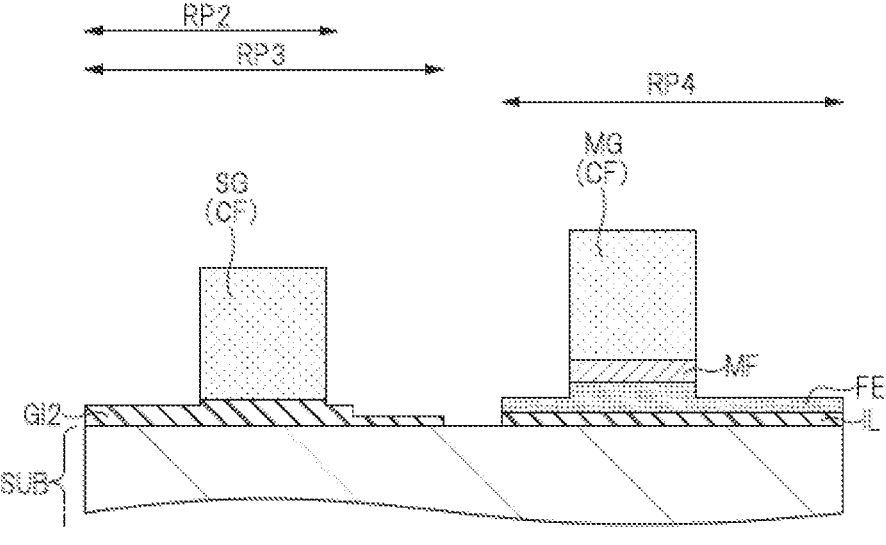
FIG. 35 is a main part cross-sectional view showing the ferroelectric memory cell during a manufacturing process in the second examined example.

Main Features of First Embodiment Compared to Second Examined Example and Third Examined Example Features related to the formation position of the resist patterns RP2 to RP4 will be described below. FIG. 17 and FIG. 18 show formation positions of the resist patterns RP2 to RP4 in the first embodiment. FIG. 34 and FIG. 35 show formation positions of the resist patterns RP2 to RP4 in the second examined example. FIG. 17 and FIG. 34 show the state during the dry etching process of FIG. 10. FIG. 18 and FIG. 35 show the state during the dry etching process of FIG. 14.

As shown in FIG. 17, in the first embodiment, the position of the end portion of the resist pattern RP2 is set such that the region used as the gate dielectric film GI2 of the select transistor SQ is covered with the protective film PVF. The end portion of the resist pattern RP3 is set at a position closer to the region where the memory transistor MQ is formed than the end portion of the resist pattern RP2. As a result, a part of the gate dielectric film GI2 exposed from the protective film PVF is left.

An end portion of the resist pattern RP4 is set at a position overlapping a part of the resist pattern RP3. In this state, when the dry etching process of FIG. 10 is performed, the metal film MF and the ferroelectric film FE are patterned such that the end portion of each of the metal film MF and the ferroelectric film FE is located on the gate dielectric film GI2 exposed from the protective film PVF. Here, the gate dielectric film GI2 exposed from the protective film PVF and the resist pattern RP4 is etched, and the thickness of the gate dielectric film GI2 is reduced.

Then, as shown in FIG. 18, in the dry etching process of FIG. 14, the gate dielectric film GI2 exposed from the gate electrode SG and the ferroelectric film FE is etched again, and the thickness of the gate dielectric film GI2 is further reduced.

On the other hand, as shown in FIG. 34, in the second examined example, the formation positions of the resist pattern RP2 and the resist pattern RP3 are the same as that of the first embodiment, but the end portion of the resist pattern RP4 is set at a position away from the resist pattern RP3. In this state, when the dry etching process of FIG. 10 is performed, the paraelectric film IL and the gate dielectric film GI2 each exposed from the protective film PVF and the resist pattern RP4 are etched, and their thicknesses are reduced.

Because the paraelectric film IL is thinner than the gate dielectric film GI2, the paraelectric film IL may be removed and the semiconductor substrate SUB may be exposed depending on the dry etching process.

Then, as shown in FIG. 35, in the dry etching process of FIG. 14, the paraelectric film IL and the gate dielectric film GI2 each exposed from the gate electrode SG and the ferroelectric film FE are etched again, and their thicknesses are further reduced. At this stage, the paraelectric film IL is completely removed and the semiconductor substrate SUB is exposed. If the dry etching process is continued while the semiconductor substrate SUB is exposed, the semiconductor substrate SUB is damaged and crystalline defects or the like are generated.

In the first embodiment, the formation position of the resist pattern RP4 is adjusted such that the paraelectric film IL is not exposed during the dry etching process of FIG. 10 and FIG. 14. Even if the thickness of the gate dielectric film GI2 is reduced, the semiconductor substrate SUB is not exposed because the thickness of the gate dielectric film GI2 is sufficiently thick with respect to the thickness of the paraelectric film IL.

Figure 36:
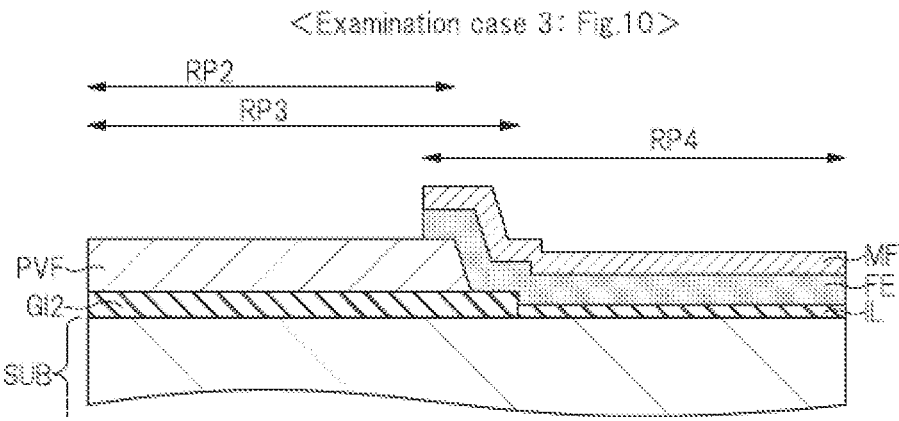
FIG. 36 is a main part cross-sectional view showing the ferroelectric memory cell during a manufacturing process in a third examined example.
Figure 37:
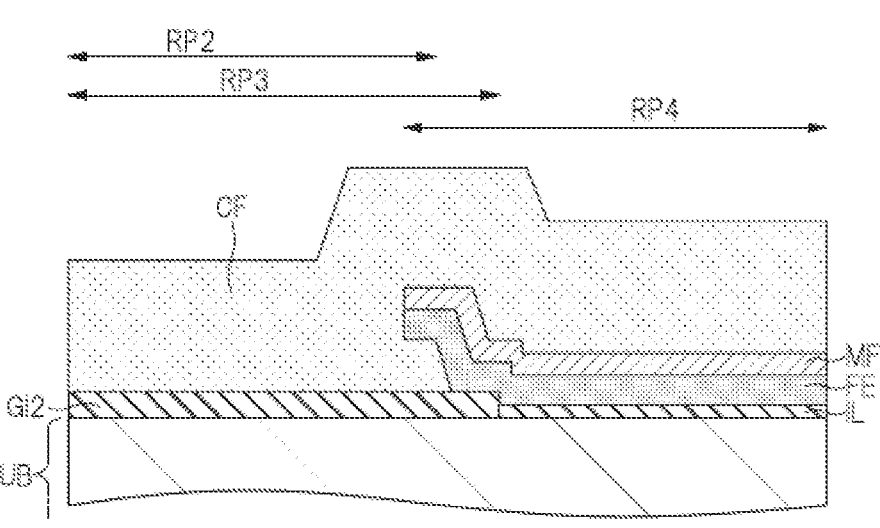
FIG. 37 is a main part cross-sectional view showing the ferroelectric memory cell during a manufacturing process in the third examined example.

FIG. 36 and FIG. 37 show formation positions of the resist patterns RP2 to RP4 in the third examined example. FIG. 36 shows a state during the dry etching process of FIG. 10, and FIG. 37 shows a state during the forming of the conductive film CF of FIG. 12.

In the third examined example, the formation positions of the resist pattern RP2 and the resist pattern RP3 are the same as that of the first embodiment, but the end portion of the resist pattern RP4 is set at a position overlapping with the resist pattern RP2 as well as the resist pattern RP3. When the dry etching process of FIG. 10 is performed in this state, the metal film MF and the ferroelectric film FE are patterned so as to cover a part of the protective film PVF. Therefore, when the protective film PVF is removed in FIG. 11, the metal film MF and the ferroelectric film FE are left like an eaves.

As shown in FIG. 37, when the conductive film CF of FIG. 12 is formed, the conductive film CF is also formed under the eaves-shaped metal film MF and the ferroelectric film FE. Then, after the metal film MF and the ferroelectric film FE are removed by the dry etching process of FIG. 14, the conductive film CF formed under the eaves is not removed, and is likely to remain as a residue. Such residues may lead to leakage passes or may scatter to other parts of the semiconductor substrate SUB and remain as manufacturing foreign objects.

By appropriately setting the formation positions of the resist patterns RP2 to RP4 as in the first embodiment, it is possible to suppress the possibility that the above-described problems occur.

Second Embodiment

The semiconductor device and method of manufacturing the same in the second embodiment will be described below with reference to FIG. 19 to FIG. 21. Note that, in the following description, differences from the first embodiment will be mainly described, and the description of overlapping points with the first embodiment will be omitted.

Figure 19:
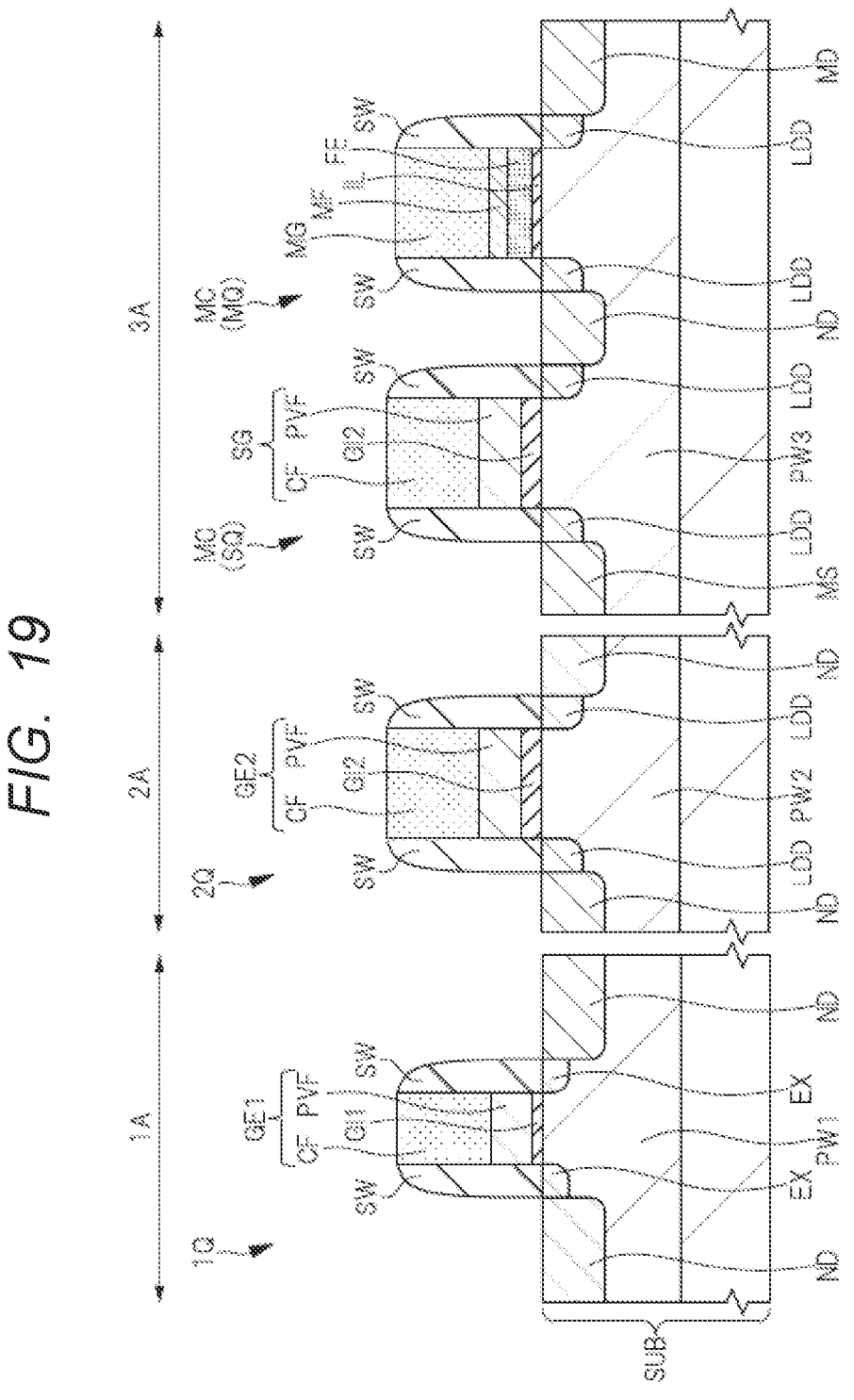
FIG. 19 is a cross-sectional view showing a semiconductor device in a second embodiment.

As shown in FIG. 19, in the second embodiment, the protective film PVF is a conductive film such as a polycrystalline silicon film into which n-type impurities are implanted, and is used as part of each of the gate electrode GE1, the gate electrode GE2, and the select gate electrode SG. Each of the gate electrode GE1, the gate electrode GE2, and the select gate electrode SG is formed of a conductive film CF and a protective film PVF.

Figure 20:
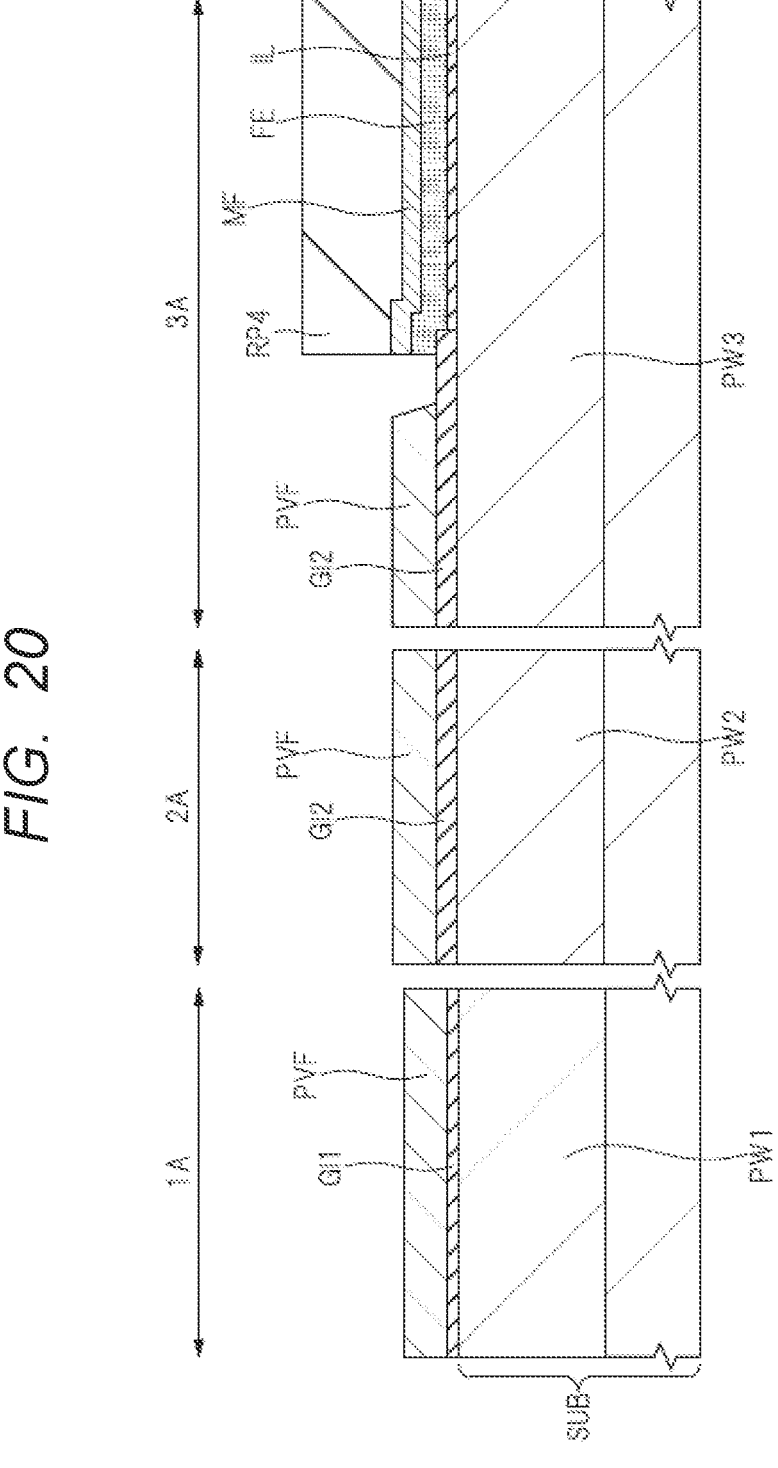
FIG. 20 is a cross-sectional view showing a manufacturing process of the semiconductor device in the second embodiment.

FIG. 20 shows a state after the manufacturing process of FIG. 10. After the amorphous film AM is crystallized to form a ferroelectric film FE and the metal film MF and the ferroelectric film FE are patterned, the protective film PVF is left without being removed.

Thereafter, by forming a conductive film CF and patterning the conductive film CF and the protective film PVF using the resist pattern RP5 as a mask, the gate electrode GE1, the gate electrode GE2, and the select gate electrode SG are formed.

Figure 21:
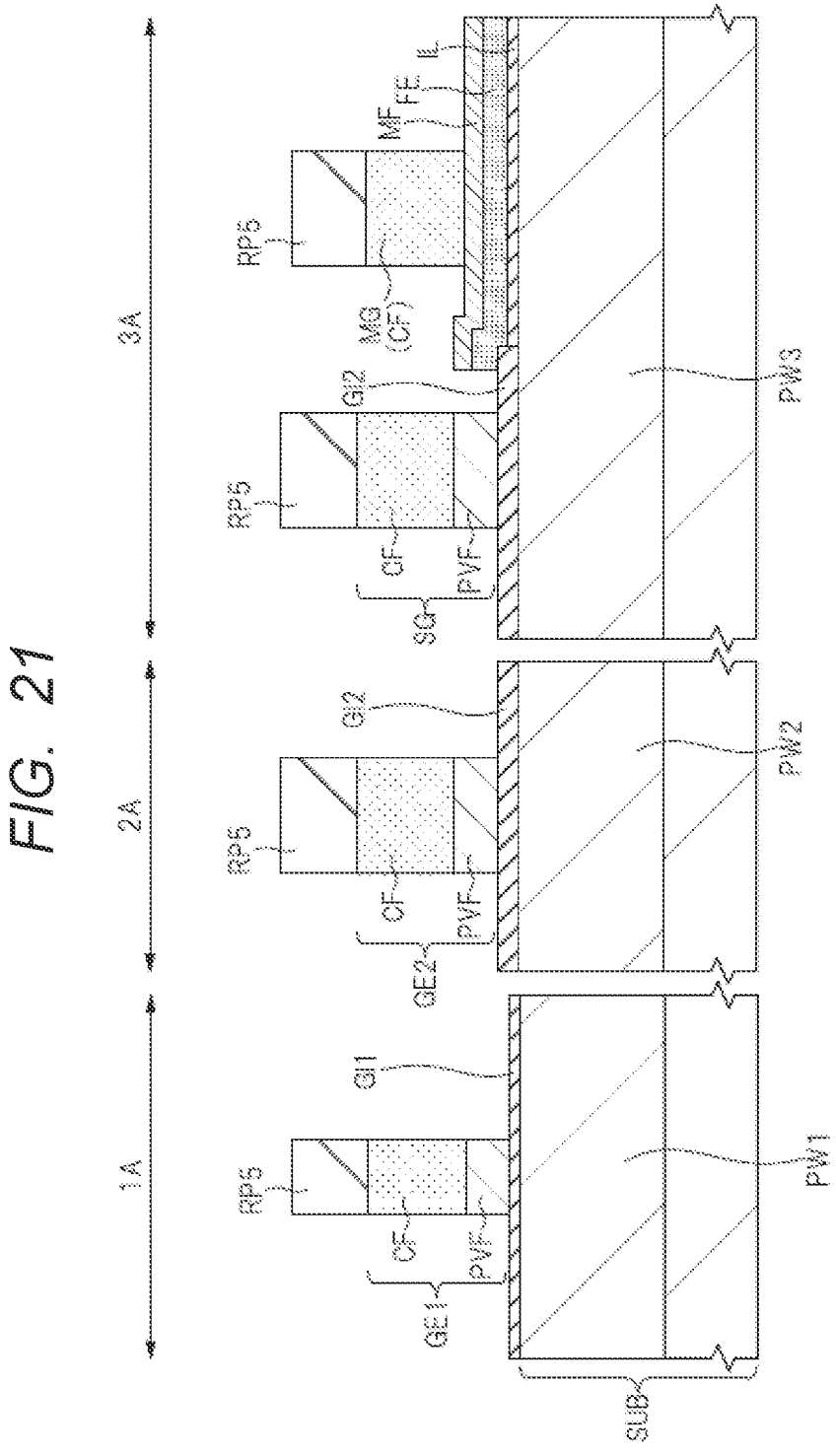
FIG. 21 is a cross-sectional view showing a manufacturing process of the semiconductor device following FIG. 20.

That is, as shown in FIG. 21, first, by CVD method, a conductive film CF is formed on the protective film PVF in the region 1A, the region 2A, and the region 3A and on the metal film MF in the region 3A. Next, by patterning the conductive film CF and the protective film PVF, the gate electrode GE1 is formed on the gate dielectric film GI1 in the region 1A, the gate electrode GE2 is formed on the gate dielectric film GI2 in the region 2A, the select gate electrode SG is formed on the gate dielectric film GI2 in the region 3A, and the memory gate electrode MG is formed on the metal film MF in the region 3A.

Subsequent manufacturing steps are the same as those in FIG. 14 and thereafter.

Third Embodiment

A manufacturing method of the semiconductor device in the third embodiment will be described below with reference to FIG. 22 to FIG. 25. Note that, in the following description, differences from the first embodiment will be mainly described, and the description of overlapping points with the first embodiment will be omitted.

In the first embodiment, after the metal film MF and the ferroelectric film AM are formed and the amorphous film AM is crystallized to form the ferroelectric film FE, the metal film MF and the ferroelectric film FE are patterned.

In the third embodiment, only the amorphous film AM is formed first, and after the amorphous film AM is patterned, the metal film MF is formed, and the amorphous film AM is crystallized to form the ferroelectric film FE.

Figure 22:
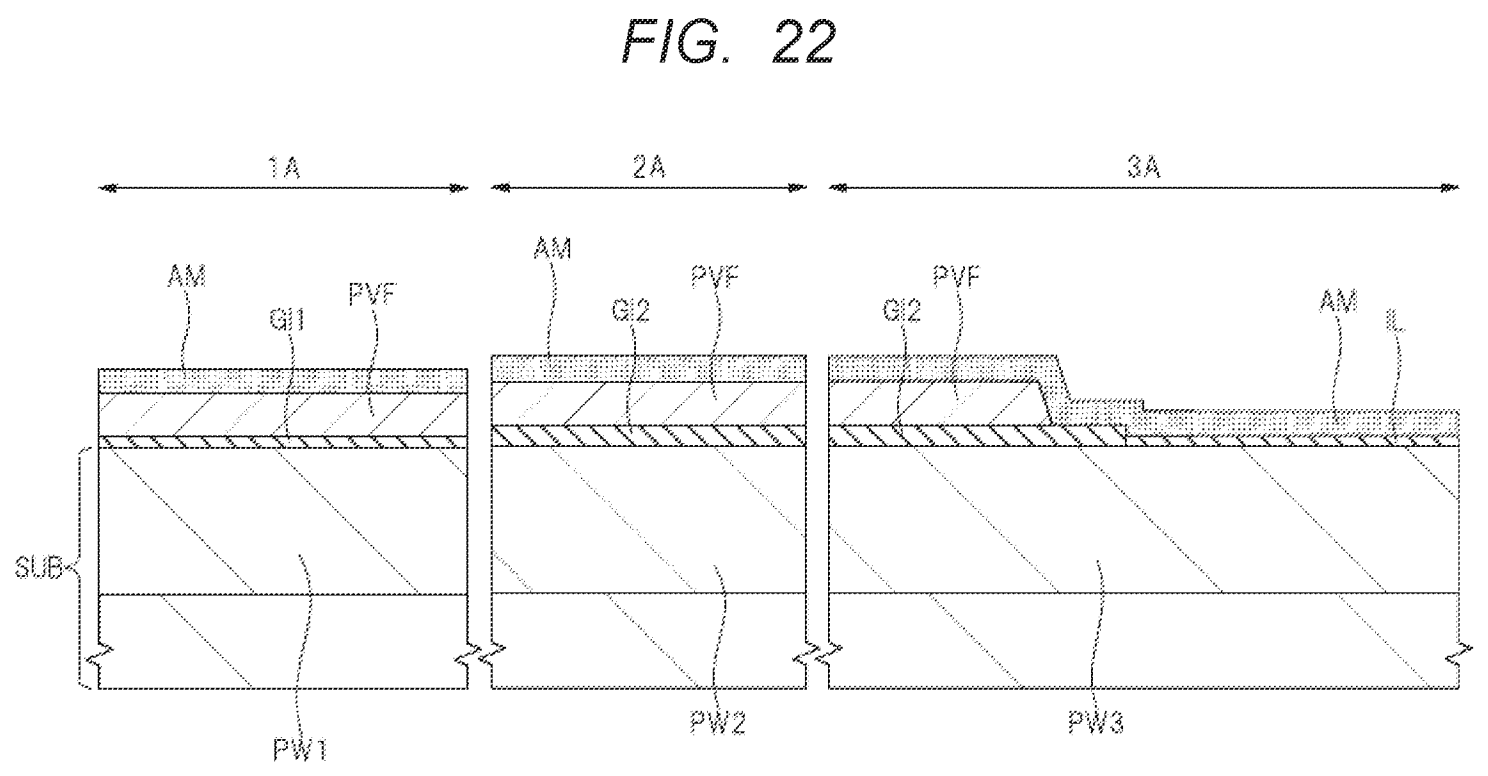

FIG. 22 shows a state after the manufacturing process of FIG. 8. As shown in FIG. 22, the amorphous film AM is formed on the protective film PVF in the region LA, on the protective film PVF in the region 2A, and on the paraelectric film IL in the region 3A by ALD method. Here, in the region 3A, the amorphous film AM is also formed on the protective film PVF and the gate dielectric film GI2.

Figure 23:
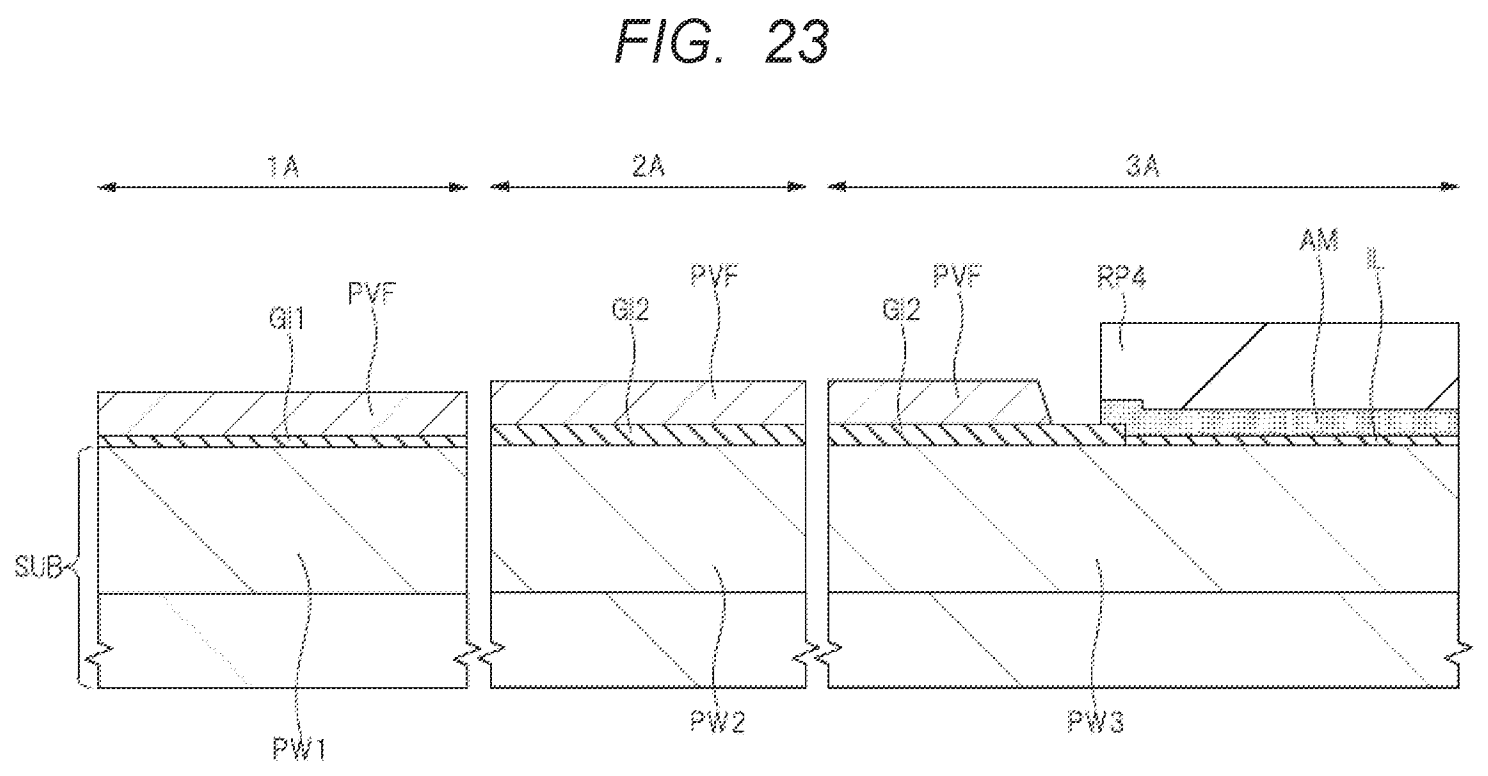

As shown in FIG. 23, a resist pattern RP4 opening a part of the region 3A is formed on the amorphous film AM in the region 3A. Next, dry etching process is performed using the resist pattern RP4 as a mask. Thereby, the amorphous film AM in the region 1A and the region 2A is selectively removed. Here, in the region 3A, the amorphous film AM is selectively removed such that a part of the amorphous film AM is left on a part of the gate dielectric film GI2 and the paraelectric film IL. That is, in the region 3A, a part of the amorphous film AM is left such that the amorphous film AM does not cover the protective film PVF. Thereafter, the resist pattern RP4 is removed by asking.

The dry etching process is the same as the dry etching process of FIG. 10. The time for removing the amorphous film AM by the dry etching process is shorter than the time for removing the ferroelectric film FE by the dry etching process. Therefore, since the time for etching process can be shortened, it is possible to prevent the thickness of the gate dielectric film GI2 exposed from the protective film PVF from becoming thinner in the region 3A.

Figure 24:
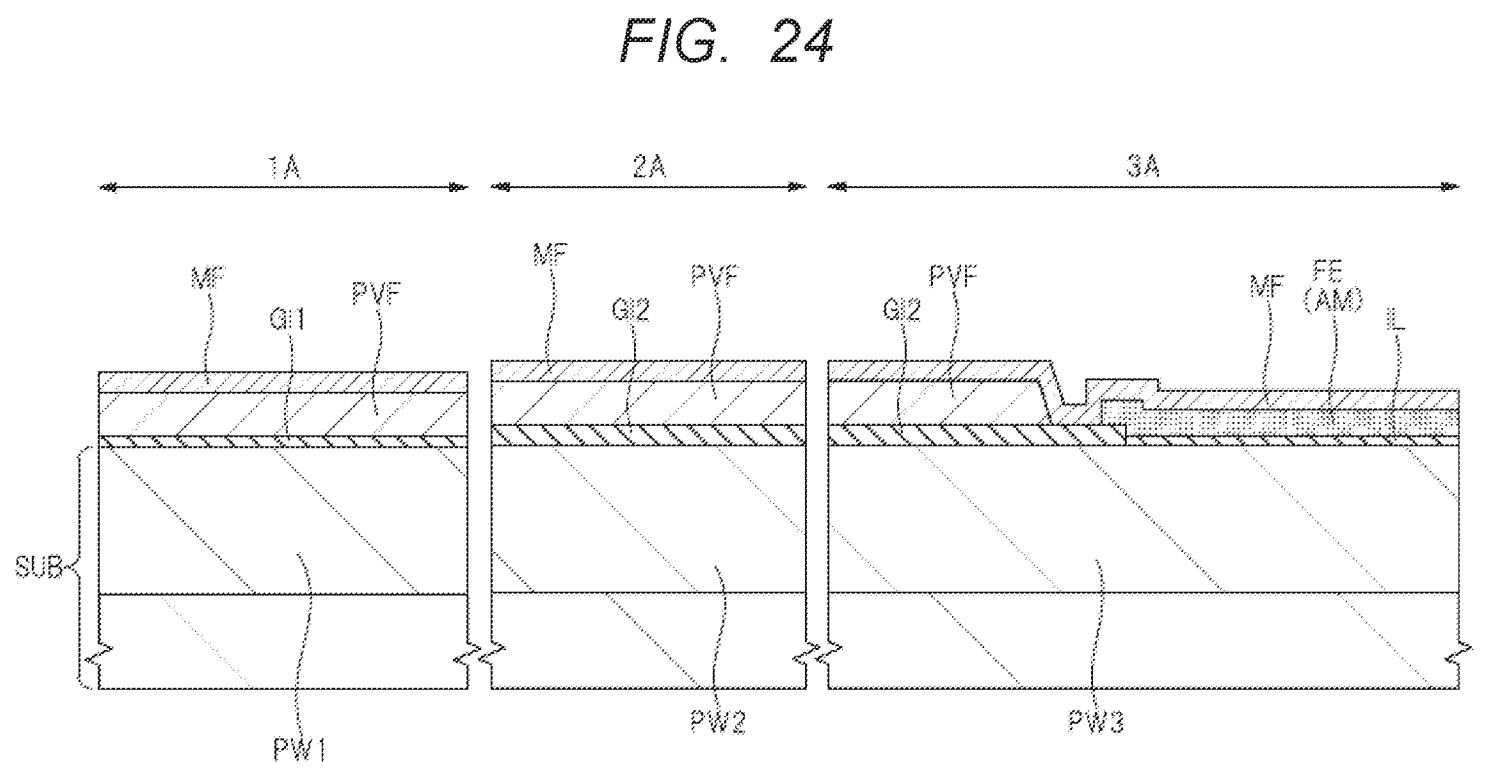

As shown in FIG. 24, the metal film MF is formed on the protective film PVF in the region 1A, on the protective film PVF in the region 2A, and on the amorphous film AM in the region 3A. Here, in the region 3A, the metal film MF is also formed on the protective film PVF and the gate dielectric film GI2. Next, by performing a heat treatment, the amorphous film AM is crystallized to form the ferroelectric film FE.

In the third embodiment, since the crystallization step is performed prior to the metal film MF being patterned, the area of the metal film MF in the wafer surface is left large. Therefore, stresses are sufficiently generated from the metal film MF to the ferroelectric film FE, and the entire ferroelectric film FE can be efficiently crystallized.

Figure 25:
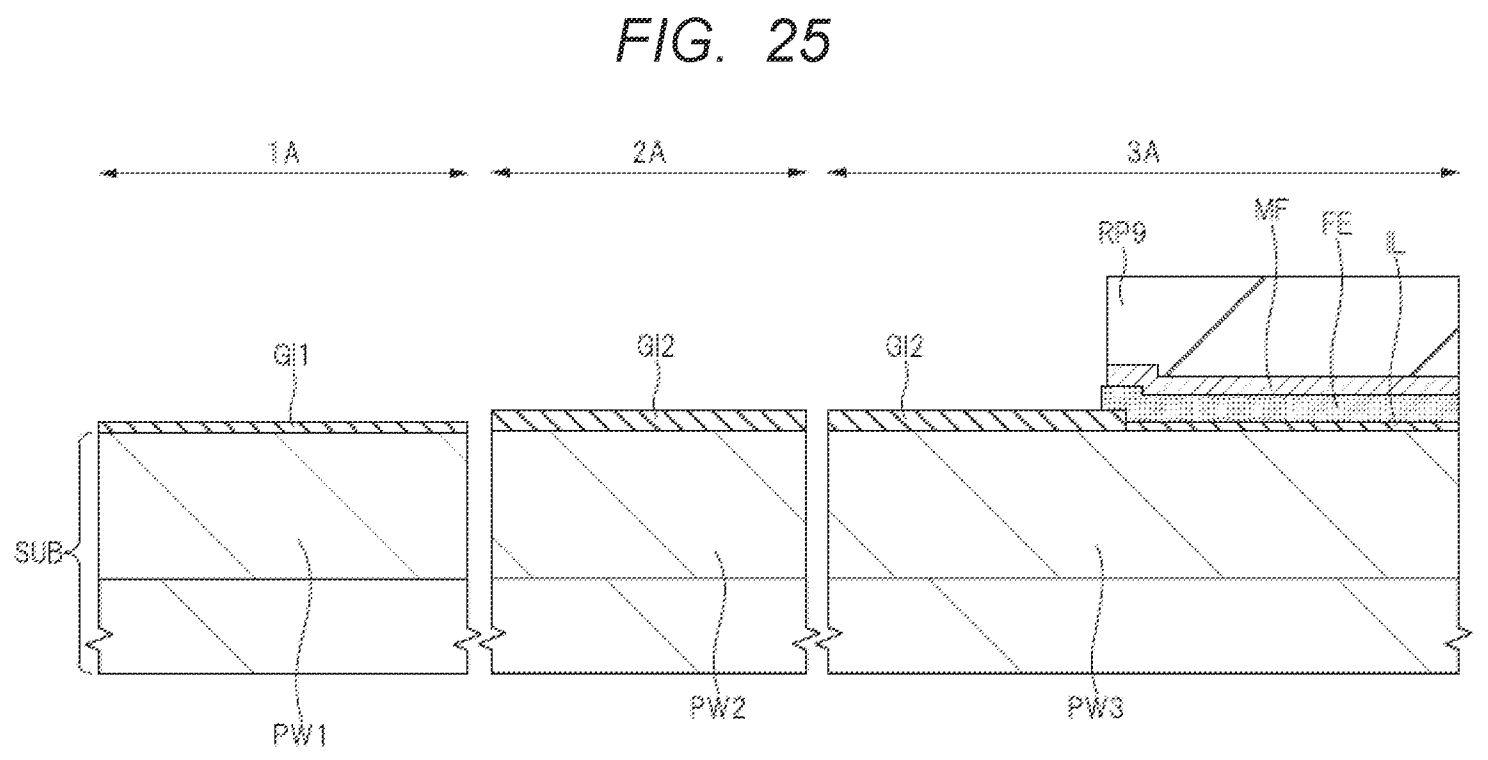

As shown in FIG. 25, a resist pattern RP9 opening the region 1A, the region 2A, and a part of the region 3A is formed on the metal film MF in the region 3A. Next, dry etching process is performed using the resist pattern RP9 as a mask. As a result, the metal film MF in the region LA and the region 2A is selectively removed. Here, in the region 3A, the metal film MF is selectively removed such that a part of the metal film MF is left on the ferroelectric film FE. That is, in the region 3A, a part of the metal film MF is left such that the metal film MF does not cover the protective film PVF.

Next, the protective film PVF in the region LA, the region 2A, and the region 3A is selectively removed by etching process. Thereafter, the resist pattern RP9 is removed by asking.

Subsequent manufacturing steps are the same as those in FIG. 12 and thereafter.

Note that in the third embodiment as well as in the second embodiment, the protective film PVF may be used as a part of each of the gate electrode GE1, the gate electrode GE2, and the select gate electrode SG. That is, in FIG. 24, the protective film PVF in the region LA, the region 2A, and the region 3A may be left.

Fourth Embodiment

Manufacturing method of the semiconductor device in the fourth embodiment will be described below with reference to FIG. 26 to FIG. 28. Note that, in the following description, differences from the first embodiment will be mainly described, and the description of overlapping points with the first embodiment will be omitted.

In the fourth embodiment, an SOI substrate is applied to the region LA where the low withstand voltage MOSFET1Q is formed. The SOI substrate includes the semiconductor substrate SUB, a dielectric layer BOX formed on the semiconductor substrate SUB, and a semiconductive layer SL formed on the dielectric layer BOX. The dielectric layer BOX is, for example, a silicon oxide film, and the thickness of the dielectric layer BOX is, for example, 10 nm or more and 20 nm or less. The semiconductor layer SL is formed of, for example, silicon, and the thickness of the semiconductor layer SL is, for example, 10 nm or more and 20 nm or less.

Figure 26:
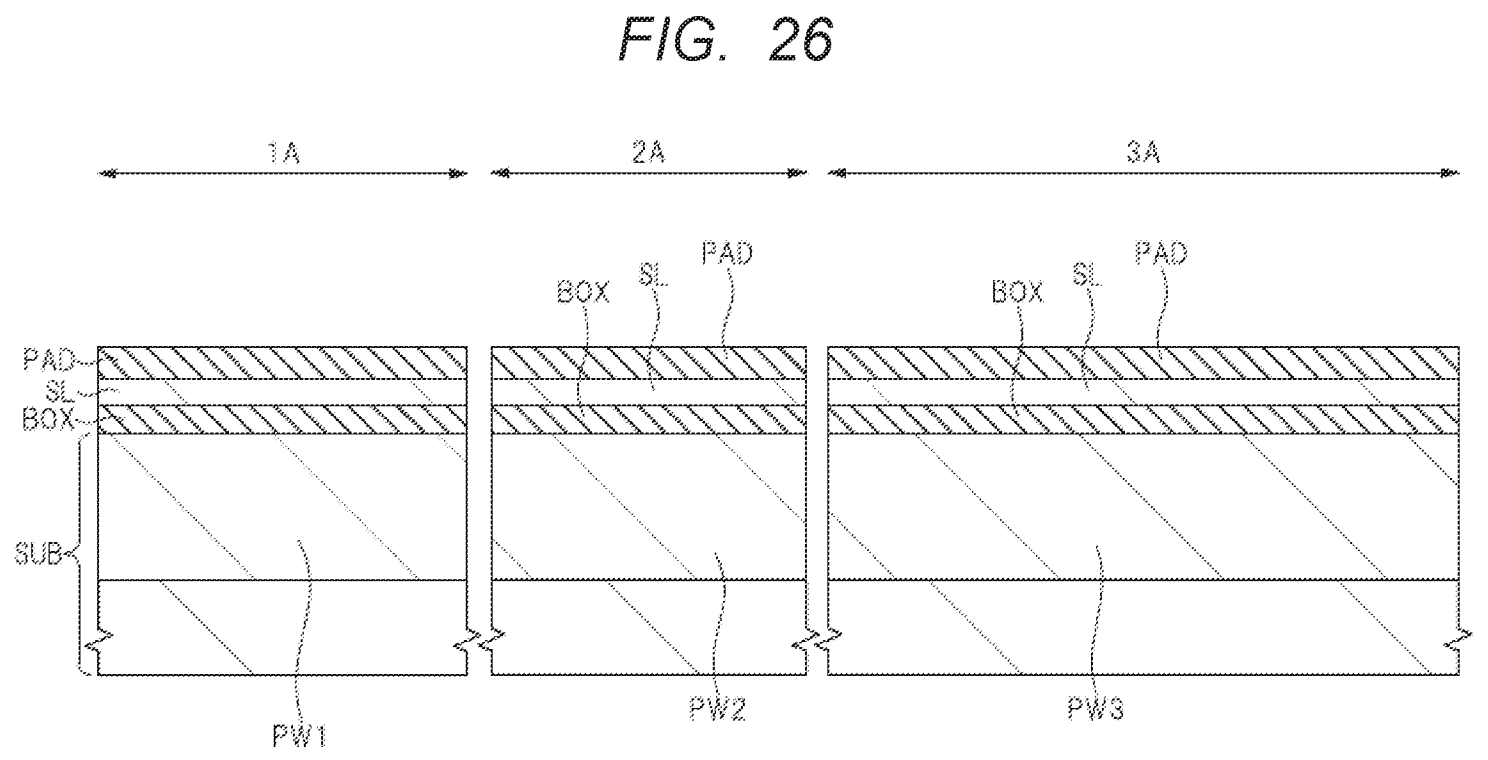
Figure 27:
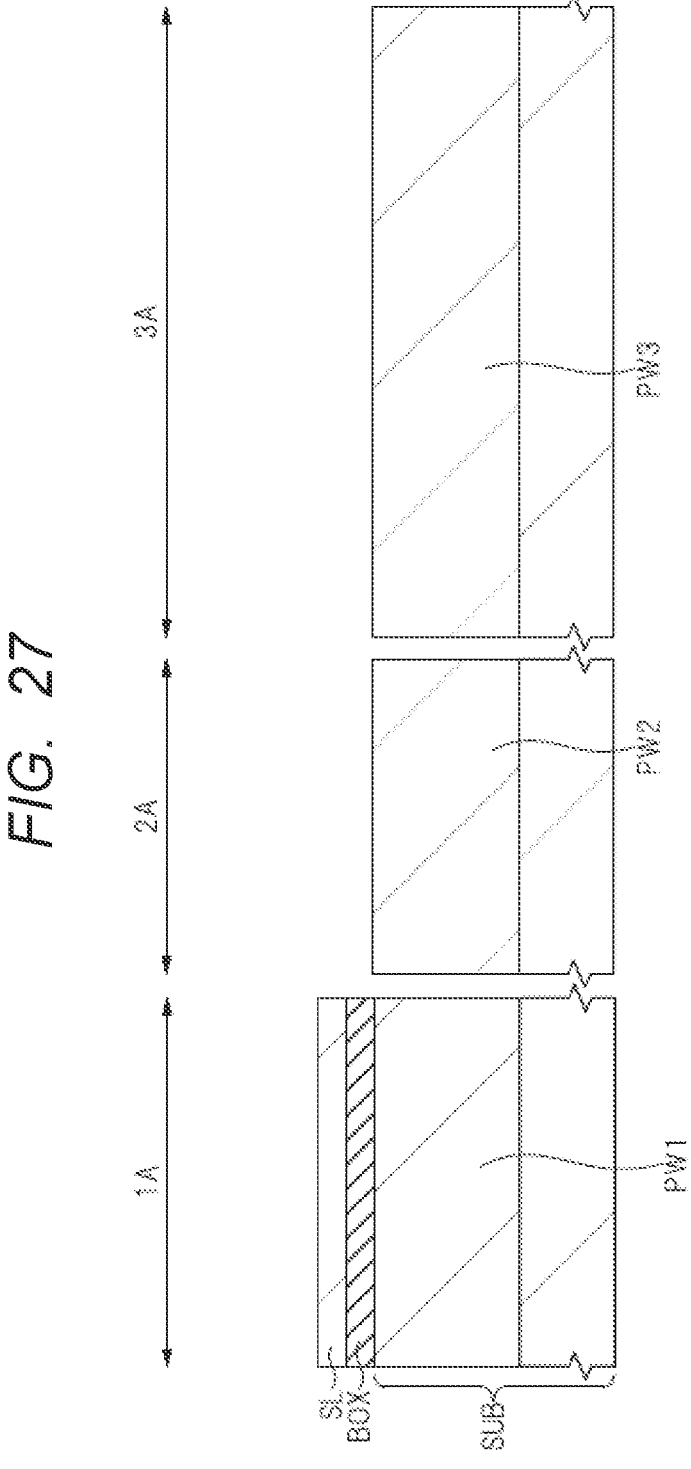
FIG. 27 is a cross-sectional view showing a manufacturing process of the semiconductor device following FIG. 26.
Figure 28:
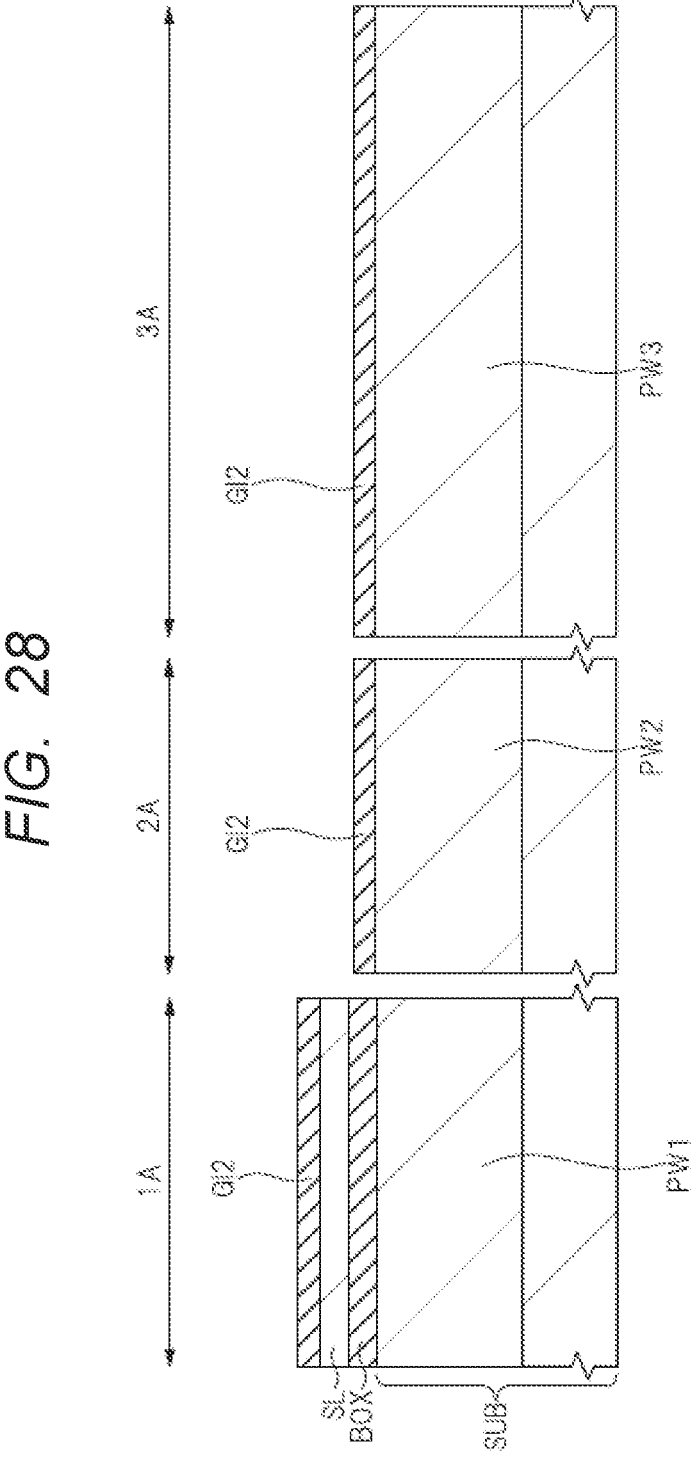
FIG. 28 is a cross-sectional view showing a manufacturing process of the semiconductor device following FIG. 27.

In the manufacturing method of the semiconductor device in the fourth embodiment, the manufacturing steps of FIG. 26 to FIG. 28 are performed prior to the step of forming the gate dielectric film GI2.

First, as shown in FIG. 26, the SOI substrate is prepared. In the regions LA to 3A, the dielectric layer BOX and the semiconductor layer SL are formed on the semiconductor substrate SUB, and a dielectric film PAD such as a silicon oxide film is formed on the semiconductor layer SL. Next, by photolithography technique and ion implantation method, a well region PW1 is formed in the semiconductor substrate SUB in the region LA, a well region PW2 is formed in the semiconductor substrate SUB in the region 2A, and a well region PW3 is formed in the semiconductor substrate SUB in the region 3A.

As shown in FIG. 27, by photolithography technique and dry etching process, the dielectric film PAD and the semiconducting layer SL in the region 2A and the region 3A are selectively removed. Next, the dielectric film PAD in the region 1A and the dielectric layer BOX in the region 2A and the region 3A are selectively removed by wet etching process.

As shown in FIG. 28, the gate dielectric film GI2 is formed on the semiconductor layer SL in the region 1A and on the semiconductor substrate SUB in the region 2A and the region 3A by, for example, thermal oxidation method.

Subsequent manufacturing steps are the same as in FIG. 5 and thereafter. Note that the gate dielectric film GI1 formed in FIG. 6 is formed on the semiconducting layer SL in the region LA. Further, the extension region EX formed in FIG. 16 is formed in the semiconducting layer SL. Further, the diffusion region ND in the region LA formed thereafter is also formed in the semiconducting layer SL.

Although the present invention has been described in detail based on embodiments, the present invention is not limited to the above-described embodiments, and various modifications can be made without departing from the gist of the present invention.

What is claimed is:

1. A method of manufacturing a semiconductor device having a first region in which a first MOSFET is formed, a second region in which a second MOSFET is formed and a third region in which a ferroelectric memory cell is formed, the method comprising:

(a) forming a second gate dielectric film on a semiconductor substrate in the first region, the second region and the third region;

(b) after the (a), selectively removing the second gate dielectric film in the first region;

(c) after the (b), forming a first gate dielectric film having a thinner thickness than the second gate dielectric film on the semiconductor substrate in the first region;

(d) after the (c), forming a protective film on the first gate dielectric film in the first region, the second gate dielectric film in the second region and the second gate dielectric film in the third region;

(e) after the (d), selectively removing the protective film in the third region;

(f) after the (e), selectively removing the second gate dielectric film in the third region;

(g) after the (f), forming a paraelectric film having a thinner thickness than the second gate dielectric film on the semiconductor substrate in the third region;

(h) after the (g), forming an amorphous film formed of a material including a metal oxide and a first element on the protective film in the first region, the protective film in the second region and the paraelectric film in the third region;

(i) after the (h), forming a metal film on the amorphous film in the first region, the second region and the third region;

(j) after the (i), crystallizing the amorphous film to form a ferroelectric film by performing a heat treatment; and (k) after the (j), selectively removing the metal film and the ferroelectric film in the first region and the second region.

2. The method according to claim 1, wherein in the (e), in the third region, the protective film is selectively removed such that a part of the protective film is left on the second gate dielectric film, wherein in the (f), in the third region, the second gate dielectric film is selectively removed such that the protective film and a part of the second gate dielectric film exposed from the protective film are left, wherein in the (h), in the third region, the amorphous film is formed on the protective film and the second gate dielectric film, and wherein in the (k), in the third region, the metal film and the ferroelectric film are selectively removed such that a part of each of the metal film and the ferroelectric film is left on the part of the second gate dielectric film and the paraelectric film.

3. The method according to claim 2, wherein in the (k), in the third region, the part of each of the metal film and the ferroelectric film is left such that the metal film and the ferroelectric film do not cover the protective film.

4. The method according to claim 2, comprising:

(l) after the (k), selectively removing the protective film in the first region, the second region and the third region;

(m) after the (l), forming a first conductive film on the first gate dielectric film in the first region, the second gate dielectric film in the second region, the second gate dielectric film in the third region and the metal film in the third region;

(n) after the (m), by patterning the first conductive film, forming a first gate electrode on the first gate dielectric film in the first region, forming a second gate electrode on the second gate dielectric film in the second region, forming a select gate electrode on the second gate dielectric film in the third region and forming a memory gate electrode on the metal film in the third region; and (o) after the (n), in the third region, removing the metal film and the ferroelectric film each exposed from the memory gate electrode in a state where the first gate electrode and the first gate dielectric film in the first region are covered with a resist pattern.

5. The method according to claim 2, comprising:

(p) after the (k), forming a first conductive film on the protective film in the first region, the protective film in the second region, the protective film in the third region and the metal film in the third region;

(q) after the (p), by patterning the first conductive film and the protective film, forming a first gate electrode on the first gate dielectric film in the first region, forming a second gate electrode on the second gate dielectric film in the second region, forming a select gate electrode on the second gate dielectric film in the third region and forming a memory gate electrode on the metal film in the third region; and (r) after the (q), in the third region, removing the metal film and the ferroelectric film each exposed from the memory gate electrode in a state where the first gate electrode and the first gate dielectric film in the first region are covered with a resist pattern, wherein the protective film is formed of a second conductive film.

6. The method according to claim 1, comprising:

(s) before the (a), preparing an SOI substrate including the semiconductor substrate, a dielectric layer formed on the semiconductor substrate and a semiconductor layer formed on the dielectric layer; and (t) between the (s) and the (a), removing the semiconductor layer and the dielectric layer in the second region and the third region, wherein in the (a), the second gate dielectric film in the first region is formed on the semiconductor layer, and wherein in the (c), the first gate dielectric film in the first region is formed on the semiconductor layer.

7. The method according to claim 1, wherein the protective film is a polycrystalline silicon film or a silicon nitride film.

8. The method according to claim 1, wherein the metal oxide is a hafnium oxide or a gallium oxide, and wherein the first element is any one of zirconium, silicon, yttrium, nitrogen, germanium, lanthanum and ytterbium.

* * * * *